US012745529B2

(12) United States Patent
Adachi et al.

(10) Patent No.: US 12,745,529 B2
(45) Date of Patent: Sep. 22, 2026

(54) DISPLAY DEVICE AND METHOD FOR MANUFACTURING DISPLAY DEVICE

(71) Applicant: SHARP KABUSHIKI KAISHA, Sakai City (JP)

(72) Inventors: Takahiro Adachi, Sakai City (JP); Yasushi Asaoka, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 445 days.

(21) Appl. No.: 18/283,662

(22) PCT Filed: Apr. 20, 2021

(86) PCT No.: PCT/JP2021/016023
§ 371 (c)(1),
(2) Date: Sep. 22, 2023

(87) PCT Pub. No.: WO2022/224345
PCT Pub. Date: Oct. 27, 2022

(65) Prior Publication Data
US 2024/0164198 A1 May 16, 2024

(51) Int. Cl.
*H10K 50/13* (2023.01)
*G09F 9/30* (2006.01)
(Continued)

(52) U.S. Cl.
CPC ......... *H10K 59/32* (2023.02); *H10K 59/1201* (2023.02); *H10K 59/35* (2023.02); *H10K 71/00* (2023.02); *H10K 71/15* (2023.02)

(58) Field of Classification Search
CPC ........... G09F 9/30; H05B 33/10; H05B 33/12; H05B 33/14; H10K 50/13; H10K 59/32;
(Continued)

(56) References Cited

U.S. PATENT DOCUMENTS

2002/0072139 A1 6/2002 Kashiwabara
2003/0178621 A1* 9/2003 Kashiwabara ....... H10K 71/233 257/40
(Continued)

FOREIGN PATENT DOCUMENTS

CN 107394020 A 11/2017
CN 111863917 A 10/2020
(Continued)

*Primary Examiner* — Omar F Mojaddedi
(74) *Attorney, Agent, or Firm* — ScienBiziP, P.C.

(57) ABSTRACT

A method for manufacturing a display device includes forming a first light-emitting layer including forming a red light-emitting layer that serves as a first light-emitting layer and that emits light in a first color at least at a red subpixel serving as a first region on a substrate by using a quantum dot resist serving as a first solution, and including a first light-emitting material and a first solvent, and forming a second light-emitting layer including forming a blue light-emitting layer that serves as a second light-emitting layer and that emits light in a second color different from the first color at least at a blue subpixel serving as a second region on the substrate by using a quantum dot colloid that is a second solution including a second light-emitting material and a second solvent in which a solubility of the first light-emitting material is less than a solubility of the first light-emitting material in the first solvent, the forming a second light-emitting layer being performed after the forming a first light-emitting layer and the red light-emitting layer serving as the first light-emitting layer and the blue light-emitting layer serving as the second light-emitting layer emit light in different regions.

18 Claims, 18 Drawing Sheets

(51) Int. Cl.

| | |
|---|---|
| ***H05B 33/12*** | (2006.01) |
| ***H05B 33/14*** | (2006.01) |
| ***H10K 59/12*** | (2023.01) |
| ***H10K 59/32*** | (2023.01) |
| ***H10K 59/35*** | (2023.01) |
| ***H10K 71/00*** | (2023.01) |
| ***H10K 71/15*** | (2023.01) |

(58) Field of Classification Search
CPC .. H10K 59/1201; H10K 59/35; H10K 59/122; H10K 71/00; H10K 71/15; H10K 71/135
See application file for complete search history.

(56) References Cited

U.S. PATENT DOCUMENTS

| | | | | |
|---|---|---|---|---|
| 2006/0263919 | A1 | 11/2006 | Kashiwabara | |
| 2008/0258616 | A1 | 10/2008 | Kashiwabara | |
| 2013/0168652 | A1* | 7/2013 | Nam | H10K 50/13 438/45 |
| 2018/0358585 | A1* | 12/2018 | Yoneda | H10K 50/13 |
| 2019/0326539 | A1* | 10/2019 | Chung | H10K 50/13 |
| 2021/0226172 | A1 | 7/2021 | Chung et al. | |
| 2022/0037424 | A1 | 2/2022 | Zhang | |
| 2023/0422577 | A1* | 12/2023 | Seo | H05B 33/28 |

FOREIGN PATENT DOCUMENTS

| | | | |
|---|---|---|---|
| JP | 2000-208254 | A | 7/2000 |
| JP | 2002-367775 | A | 12/2002 |
| JP | 2005-129450 | A | 5/2005 |
| JP | 2006-245178 | A | 9/2006 |
| JP | 2009-176964 | A | 8/2009 |
| JP | 2019-165006 | A | 9/2019 |

* cited by examiner

DISPLAY DEVICE AND METHOD FOR MANUFACTURING DISPLAY DEVICE

TECHNICAL FIELD

The disclosure relates to a display device and a method for manufacturing the display device.

BACKGROUND ART

In recent years, a display device including a quantum dot light emitting diode (QLED) or an organic light emitting diode (OLED) as a light-emitting element has attracted much attention.

However, in a manufacturing process of a display device including a QLED or an OLED, in particular, interface mixing or the like occurs when a plurality of light-emitting layers different from each other are formed, which causes a problem.

PTL 1 describes that the interface mixing is prevented by separately providing a compatibilization preventing layer.

CITATION LIST

Patent Literature

PTL 1: JP 2005-129450 A

SUMMARY

Technical Problem

In the case where the compatibilization preventing layer is separately provided as in PTL 1 as described above, an increase in the number of processes and an increase in the thickness of a light-emitting element cause problems.

Thus, it is also proposed to prevent the interface mixing by performing a firing step (post-baking step) for each step of forming a light-emitting layer of each color instead of separately providing the compatibilization preventing layer.

Specifically, in a display device including a light-emitting element such as an OLED or a QLED, a plurality of light-emitting elements including light-emitting layers having different light emission peak wavelengths are generally provided. In a case where the display device includes, for example, a red light-emitting layer, a green light-emitting layer, and a blue light-emitting layer as the light-emitting layers having different light emission peak wavelengths, the step of firing (the step of post-baking) is included in each of a step of forming the red light-emitting layer, a step of forming the green light-emitting layer, and a step of forming the blue light-emitting layer. When the step of firing is omitted or a step of temporarily baking is performed instead of the step of firing in the step of forming the light-emitting layer of each color, the following problems occur.

For example, in the case where the step of forming the red light-emitting layer is followed by the step of forming the green light-emitting layer, the step of forming the blue light-emitting layer, and the step of forming another layer, when the step of forming the red light-emitting layer does not include the step of firing, the red light-emitting layer formed in a predetermined shape is dissolved when the same kind of solvent as a solvent included in a solution used for forming the red light-emitting layer is used in a subsequent step.

Thus, the step of forming the light-emitting layer of each color needs to include the step of firing so that the light-emitting layer previously formed is not dissolved in the subsequent step.

As described above, by including the step of firing for each step of forming the light-emitting layer of each color, the previously formed light-emitting layer can be prevented from being dissolved. However, when the step of firing (the step of post-baking), which is a step of heat treatment at a relatively high temperature for a relatively long time, in contrast to the step of temporarily baking, which is a step of heat treatment at a relatively low temperature for a relatively short time, is performed for each step of forming the light-emitting layer of each color, a problem arises in that the productivity of the display device is significantly reduced.

An aspect of the disclosure has been made in view of the above problems, and an object thereof is to provide a method for manufacturing a display device with high productivity, and the display device.

Solution to Problem

In order to solve the problems described above, a method for manufacturing a display device according to the disclosure includes forming a first light-emitting layer configured to emit light in a first color in at least a first region on a substrate by using a first solution including a first light-emitting material and a first solvent, and forming a second light-emitting layer configured to emit light in a second color different from the first color in at least a second region different from the first region on the substrate by using a second solution including a second light-emitting material and a second solvent in which a solubility of the first light-emitting material is less than a solubility of the first light-emitting material in the first solvent, the forming a second light-emitting layer being performed after the forming a first light-emitting layer, and the first light-emitting layer and the second light-emitting layer emit light in different regions.

In order to solve the problems described above, a display device according to the disclosure includes a first light-emitting layer including a first light-emitting material, the first light-emitting layer being configured to emit light in a first color, and a second light-emitting layer including a second light-emitting material, the second light-emitting layer being configured to emit light in a second color different from the first color, the first light-emitting layer and the second light-emitting layer are in contact with each other, one of the first light-emitting material and the second light-emitting material is a polar molecule, the other of the first light-emitting material and the second light-emitting material is a non-polar molecule, and the first light-emitting layer and the second light-emitting layer emit light in different regions.

In order to solve the problems described above, a display device according to the disclosure includes a first light-emitting layer including a first light-emitting material, the first light-emitting layer being configured to emit light in a first color, and a second light-emitting layer including a second light-emitting material, the second light-emitting layer being configured to emit light in a second color different from the first color, the first light-emitting layer and the second light-emitting layer are in contact with each other, and a Hildebrand solubility parameter (an SP value) of the first light-emitting material is different from a Hildebrand solubility parameter (an SP value) of the second light-emitting material by a value being equal to or greater than 0.1.

Advantageous Effects of Disclosure

An aspect of the disclosure can provide a method for manufacturing a display device with high productivity, and the display device.

DESCRIPTION OF EMBODIMENTS

Embodiments of the disclosure will be described below with reference to FIG. 1 to FIG. 18. Hereinafter, for convenience of description, configurations having the same functions as those described in a specific embodiment are denoted by the same reference signs, and descriptions thereof will be omitted.

First Embodiment

Figure 1:
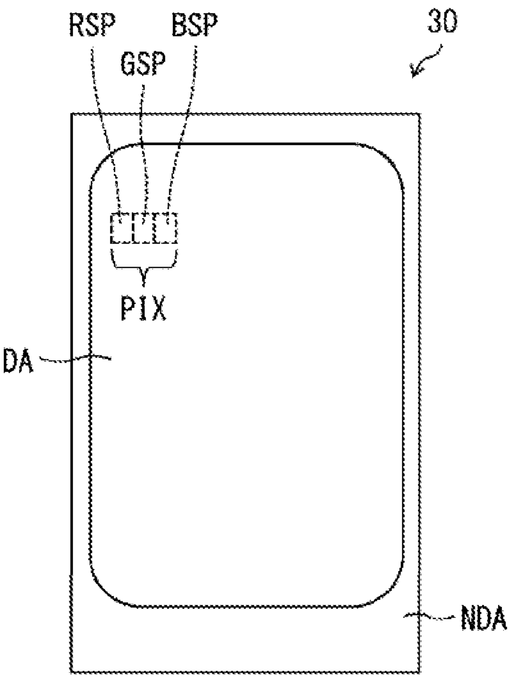
FIG. 1 is a plan view illustrating a schematic configuration of a display device according to a first embodiment.

FIG. 1 is a plan view illustrating a schematic configuration of a display device 30 according to a first embodiment.

The display device 30 includes a display region DA and a frame region NDA. A plurality of pixels PIX are provided in the display region DA of the display device 30, and each pixel PIX includes a red subpixel RSP, a green subpixel GSP, and a blue subpixel BSP. In the present embodiment, a case where one pixel PIX constituted by a red subpixel RSP (first subpixel), a green subpixel GSP (third subpixel), and a blue subpixel BSP (second subpixel) will be described as an example, but no such limitation is intended. For example, one pixel PIX may further include a subpixel of another color in addition to the red subpixel RSP, the green subpixel GSP, and the blue subpixel BSP.

Figure 2:
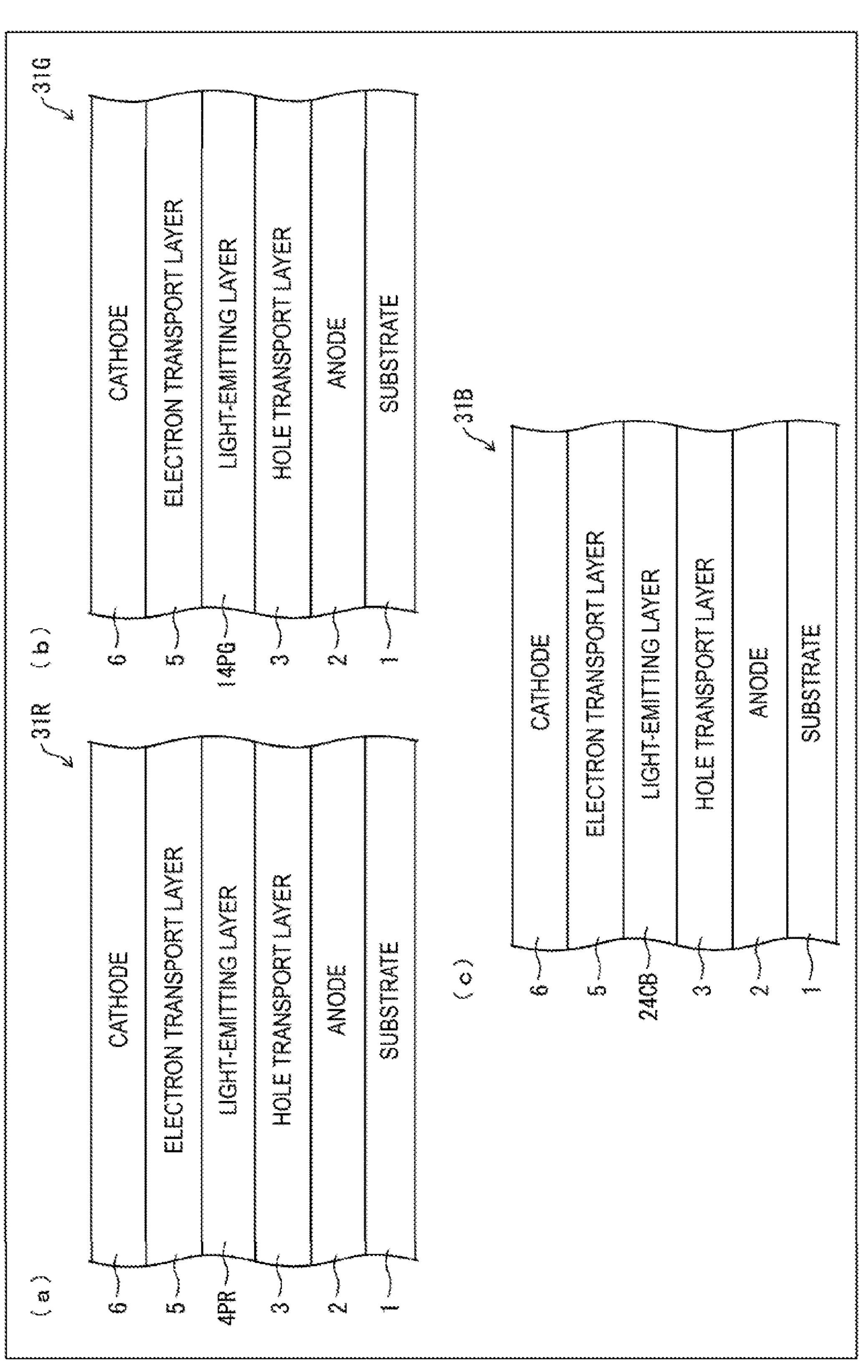
In FIG. 2, (a) is a cross-sectional view illustrating a schematic configuration of a light-emitting element included in a red subpixel of the display device illustrated in FIG. 1, (b) is a cross-sectional view illustrating a schematic configuration of a light-emitting element included in a green subpixel of the display device illustrated in FIG. 1, and (c) is a cross-sectional view illustrating a schematic configuration of a light-emitting element included in a blue subpixel of the display device illustrated in FIG. 1.

(a) of FIG. 2 is a cross-sectional view illustrating a schematic configuration of a light-emitting element 31R included in a red subpixel RSP of the display device 30 illustrated in FIG. 1, (b) of FIG. 2 is a cross-sectional view illustrating a schematic configuration of a light-emitting element 31G included in a green subpixel GSP of the display device 30 illustrated in FIG. 1, and (c) of FIG. 2 is a cross-sectional view illustrating a schematic configuration of a light-emitting element 31B included in a blue subpixel BSP of the display device 30 illustrated in FIG. 1.

The light-emitting element 31R illustrated in (a) of FIG. 2 is a light-emitting element that is provided on a substrate 1 and that emits red light, and includes an anode 2, a hole transport layer 3, a red light-emitting layer 4PR, an electron transport layer 5, and a cathode 6 in this order from the substrate 1 side.

The light-emitting element 31G illustrated in (b) of FIG. 2 is a light-emitting element that is provided on the substrate 1 and that emits green light, and includes an anode 2, a hole transport layer 3, a green light-emitting layer 14PG, an electron transport layer 5, and a cathode 6 in this order from the substrate 1 side.

The light-emitting element 31B illustrated in (c) of FIG. 2 is a light-emitting element that is provided on the substrate 1 and that emits blue light, and includes an anode 2, a hole transport layer 3, a blue light-emitting layer 24CB, an electron transport layer 5, and a cathode 6 in this order from the substrate 1 side.

The substrate 1 is one substrate provided in the display region DA and the frame region NDA of the display device 30. In the present embodiment, a case where the substrate 1 is a glass substrate will be described as an example, but the substrate 1 is not limited thereto. For example, the substrate 1 may be a flexible substrate made of resin or the like. Note that although not illustrated, a thin film transistor layer including a transistor that drives the anode 2 (or the cathode 6) is formed on the substrate 1.

In the present embodiment, a case where each of the light-emitting element 31R illustrated in (a) of FIG. 2, the light-emitting element 31G illustrated in (b) of FIG. 2, and the light-emitting element 31B illustrated in (c) of FIG. 2 has a regular layered structure in which the anode 2, the hole transport layer 3, the corresponding one of the red light-emitting layer 4PR, the green light-emitting layer 14PG, and the blue light-emitting layer 24CB, the electron transport layer 5, and the cathode 6 are formed in this order from the substrate 1 side will be described as an example, but no such limitation is intended. Each of the light-emitting element 31R illustrated in (a) of FIG. 2, the light-emitting element 31G illustrated in (b) of FIG. 2, and the light-emitting element 31B illustrated in (c) of FIG. 2 may have an inverted layered structure in which the cathode 6, the electron transport layer 5, the corresponding one of the red light-emitting layer 4PR, the green light-emitting layer 14PG, and the blue light-emitting layer 24CB, the hole transport layer 3, and the anode 2 are formed in this order from the substrate 1 side.

In the present embodiment, the case where the hole transport layer 3 is provided between the anode 2 and one of the red light-emitting layer 4PR, the green light-emitting layer 14PG, and the blue light-emitting layer 24CB will be described as an example, but no such limitation is intended. For example, a hole injection layer may be further provided between the anode 2 and the hole transport layer 3, a hole injection layer may be provided instead of the hole transport layer 3, or the hole transport layer 3 and the hole injection layer may be omitted as appropriate.

In the present embodiment, the case where the electron transport layer 5 is provided between the cathode 6 and any one layer of the red light-emitting layer 4PR, the green light-emitting layer 14PG, and the blue light-emitting layer 24CB will be described as an example, but no such limitation is intended. For example, an electron injection layer may be further provided between the cathode 6 and the electron transport layer 5, an electron injection layer may be provided instead of the electron transport layer 5, or the electron transport layer 5 and the electron injection layer may be omitted as appropriate.

Each of the light-emitting element 31R illustrated in (a) of FIG. 2, the light-emitting element 31G illustrated in (b) of FIG. 2, and the light-emitting element 31B illustrated in (c) of FIG. 2 may be a top-emitting type or a bottom-emitting type. When the light-emitting element 31R, the light-emitting element 31G, and the light-emitting element 31B has a regular layered structure described above, the cathode 6 is positioned at an upper layer than that of the anode 2. Thus, to achieve a top-emitting type, the anode 2 can be formed of an electrode material that reflects visible light and the cathode 6 can be formed of an electrode material that transmits visible light. To achieve a bottom-emitting type, the anode 2 can be formed of an electrode material that transmits visible light and the cathode 6 can be formed of an electrode material that reflects visible light. On the other hand, when the light-emitting element 31R, the light-emitting element 31G, the light-emitting element 31B has a layered film having an inverted layered structure described above, the anode 2 is positioned at an upper layer than that of the cathode 6. Thus, to achieve a top-emitting type, the cathode 6 can be formed of an electrode material that reflects visible light and the anode 2 can be formed of an electrode material that transmits visible light. To achieve a bottom-emitting type, the anode 2 can be formed of an electrode material that reflects visible light and the cathode 6 can be formed of an electrode material that transmits visible light.

The electrode material that reflects visible light is not particularly limited as long as the material can reflect visible light and has electrical conductivity. Examples include metal materials such as Al, Mg, Li, and Ag, alloys of the metal materials, a layered body of the metal materials and transparent metal oxides (for example, indium tin oxide, indium zinc oxide, indium gallium zinc oxide, and the like), or a layered body of the alloys and the transparent metal oxides.

On the other hand, the electrode material that transmits visible light is not particularly limited as long as the material can transmit visible light and has electrical conductivity. Examples include a thin film formed of a transparent metal oxide (for example, indium tin oxide, indium zinc oxide, indium gallium zinc oxide, and the like) or a metal material, such as Al, Mg, Li, and Ag.

A typical electrode formation method can be used as a film formation method of the anode 2 and the cathode 6, and examples thereof include physical vapor deposition (PVD) such as vacuum vapor deposition, sputtering, electron beam (EB) vapor deposition, and ion plating, or chemical vapor deposition (CVD). Further, a method of patterning the anode 2 and the cathode 6 is not particularly limited as long as the method is capable of precisely forming a desired pattern, and specific examples include a photolithography method and an ink-jet method.

A material to be used for the hole transport layer 3 is not particularly limited as long as the material is a hole transport material capable of stabilizing the transport of positive holes into the red light-emitting layer 4PR, the green light-emitting layer 14PG, or the blue light-emitting layer 24CB. Among these, a hole transport material having high hole mobility is preferable. Furthermore, the hole transport material is preferably a material (electron blocking material) capable of preventing the penetration of electrons that have traveled from the cathode 6. This makes it possible to increase a recombination efficiency of the holes and the electrons within the light-emitting layer.

The hole transport layer 3 may be a layer formed of an organic material, a layer formed of an organic material and an inorganic material, or a layer formed of an inorganic material. In the present embodiment, a case where the hole transport layer 3 is formed of an inorganic material that is an oxide including one or more selected from the group consisting of Zn, Ni, Mg, La, Mo, W, V, and Le will be described as an example, but the hole transport layer 3 is not limited thereto. Since such metal oxides are more chemically stable than organic materials, the reliability of the light-emitting element 31R, the light-emitting element 31G, and the light-emitting element 31B can be improved. Note that when the hole transport layer 3 is formed of an organic material, examples of the organic material include polyvinyl carbazole (PVK) or poly[(9,9-dioctylfluorenyl-2,7-diyl)-co-(4,4'-(N-(4-sec-butylphenyl))diphenylamine)] (TFB), but the hole transport layer 3 is not limited thereto.

Additionally, when a hole injection layer (not illustrated) is provided between the anode 2 and the hole transport layer 3, or when the hole injection layer is provided instead of the hole transport layer 3, a material to be used for the hole injection layer is not particularly limited as long as the material is a hole injection material capable of stabilizing the injection of holes into the red light-emitting layer 4PR, the green light-emitting layer 14PG or the blue light-emitting layer 24CB. The hole injection layer can be formed, for example, by using PEDOT, or the like.

A thickness of the hole transport layer 3 and a thickness of the hole injection layer are not particularly limited as long as a hole transport function and a hole injection function are respectively sufficiently exhibited at the thicknesses. Examples of the method of forming the hole transport layer 3 and the hole injection layer include vapor deposition, a printing method, an ink-jet method, a spin coating method, a casting method, a dipping method, a bar coating method, a blade coating method, a roll coating method, a gravure coating method, a flexographic printing method, a spray coating method, a photolithography method, and a self-organization method (alternate adsorption method, self-assembled monolayer method), but the method is not limited thereto. Among these, vapor deposition, the spin coating method, the ink-jet method, or the photolithography method are preferably used.

In the present embodiment, a case where the red light-emitting layer 4PR is formed by using a quantum dot resist (first solution) that is a solution obtained by dispersing a positive-working photosensitive resin, a quantum dot (QD) that emits red light and that serves as a first light-emitting material, and a polar ligand around the quantum dot (QD), in propylene glycol monomethyl ether acetate (PGMEA) that is a polar solvent serving as a first solvent, the blue light-emitting layer 24CB is formed by using a quantum dot colloid (second solution) that is a solution not including a photosensitive resin, the solution being obtained by dispersing a quantum dot (QD) that emits blue light and that serves as a second light-emitting material, and a non-polar ligand around the quantum dot (QD), in octane that is a non-polar solvent serving as a second solvent, and the green light-emitting layer 14PG is formed by using a quantum dot resist (third solution) that is a solution obtained by dispersing a positive-working photosensitive resin, a quantum dot (QD) that emits green light and that serves as a third light-emitting material, and a polar ligand around the quantum dot (QD), in PGMEA that is a polar solvent serving as a third solvent will be described as an example, but no such limitation is intended. For example, the photosensitive resin included in the quantum dot resist (third solution) may be a negative-working photosensitive resin. Note that in the present embodiment, a case where each solution includes a single solvent will be described as an example, but no such limitation is intended, and a plurality of solvents may be mixed as long as the mixed solvent satisfies predetermined solvent characteristics.

The quantum dot (QD) that emits red light, the quantum dot (QD) that emits green light, and the quantum dot (QD) that emits blue light can be constituted by using cores of the same material with different particle diameters. For example, a core having the largest particle diameter can be used for the quantum dot (QD) that emits red light, a core having the smallest particle diameter can be used for the quantum dot (QD) that emits blue light, and a core having a particle diameter between the particle diameter of the core used for the quantum dot (QD) that emits red light and the particle diameter of the core used for the quantum dot (QD) that emits blue light can be used for the quantum dot (QD) that emits green light. In addition, the quantum dot (QD) that emits red light, the quantum dot (QD) that emits green light, and the quantum dot (QD) that emits blue light may be formed by using cores of different materials.

Examples of the non-polar ligand described above include oleic acid, trioctylphosphine (tri-n-octylphoshine (TOP)), dodecanethiol, octanethiol, hexadecanethiol, octylamine, and the like, but the non-polar ligand is not limited thereto as long as the non-polar ligand is disposed around the quantum dot (QD) and the quantum dot (QD) can be dispersed in the non-polar solvent.

In addition, examples of the polar ligand described above include 2-(dimethyl amino)ethanethiol hydrochloride and 11-mercaptoundecanoic acid MTEG ester. However, the polar ligand is not limited thereto as long as the polar ligand is disposed around the quantum dot (QD) and the quantum dot (QD) can be dispersed in the polar solvent.

Note that a method of forming the red light-emitting layer 4PR, the blue light-emitting layer 24CB, and the green light-emitting layer 14PG will be described later.

A material to be used for the electron transport layer 5 is not particularly limited as long as the material is an electron transport material capable of transporting electrons injected from the cathode 6 into the red light-emitting layer 4PR, the green light-emitting layer 14PG, or the blue light-emitting layer 24CB. Among these, the electron transport material having high electron mobility is preferable. Furthermore, the electron transport material is preferably a material (hole blocking material) capable of preventing the penetration of holes that have traveled from the anode 2. This makes it possible to increase a recombination efficiency of the holes and the electrons within the light-emitting layer.

Examples of the electron transport material include oxadiazoles, triazoles, phenanthrolines, silole derivatives, cyclopentadiene derivatives, aluminum complexes, metal oxides (including oxide semiconductors), nitride semiconductors, and arsenide semiconductors. Specifically, examples of the oxadiazole derivatives include (2-(4-biphenylyl)-5-(4-tert-butylphenyl)-1,3,4-oxadiazole) (PBD), examples of the phenanthrolines include bathocuproine (BCP) and bathophenanthroline (BPhen), and examples of the aluminum complexes include tris(8-quinolinol)aluminum complex (Alq3), and bis(2-methyl-8-quinolinolato)(p-phenylphenolate)aluminum complex (BAlq). Examples of the metal oxides as the electron transport material include ZnO, MgZnO, $TiO_2$, $Ta_2O_3$, $SrTiO_3$, and $Mg_xZn_{1-x}O$ (where x is a rate in which Zn of ZnO is substituted with Mg). Further, examples of the inorganic semiconductor material as the electron transport material include II-VI group semiconductor materials and III-V group semiconductor materials. Examples of the II-VI group semiconductor materials include ZnS, ZnSe, ZnTe, Cds, CdSe, CdTe, HgTe, and mixed crystals thereof, and examples of the III-V group semiconductor materials include AlP, AlAs, AlN, AlSb, GaN, GaP, GaAs, GaSb, InP, InAs, InSb, InN, and mixed crystals thereof. In the present embodiment, the electron transport layer 5 is formed by using $Mg_xZn_{1-x}O$, but no such limitation is intended.

In addition, when an electron injection layer (not illustrated) is provided between the electron transport layer 5 and the cathode 6 or when the electron injection layer is provided instead of the electron transport layer 5, a material to be used for the electron injection layer is not particularly limited as long as the material is an electron injection material capable of stabilizing the injection of electrons into the red light-emitting layer 4PR, the green light-emitting layer 14PG, or the blue light-emitting layer 24CB. Examples of the electron injection material include alkali metals or alkaline earth metals, oxides of alkali metals or alkaline earth metals, fluorides of alkali metals or alkaline earth metals, and organic complexes of alkali metals, such as aluminum, strontium, calcium, lithium, cesium, magnesium oxide, aluminum oxide, strontium oxide, lithium oxide, lithium fluoride, magnesium fluoride, strontium fluoride, calcium fluoride, barium fluoride, cesium fluoride, polymethylmethacrylate, and sodium polystyrene sulfonate.

A thickness of the electron transport layer 5 and a thickness of the electron injection layer are not particularly limited as long as the electron transport function and the electron injection function are respectively sufficiently exhibited. Moreover, examples of the method of forming the electron transport layer 5 and the electron injection layer (not illustrated) include vapor deposition, a printing method, an ink-jet method, a spin coating method, a casting method, a dipping method, a bar coating method, a blade coating method, a roll coating method, a gravure coating method, a flexographic printing method, a spray coating method, a photolithography method, and a self-organization method (alternate adsorption method, self-assembled monolayer method), but the method is not limited thereto. Among these, the vapor deposition, the spin coating method, the ink-jet method, or the photolithography method are preferably used. In addition, the electron transport layer 5 may be formed of different materials, with different thicknesses, or the like, depending on the luminescent color of the red light-emitting layer 4PR, the green light-emitting layer 14PG, or the blue light-emitting layer 24CB, or may be formed of the same material with the same thickness regardless of the luminescent color of the red light-emitting layer 4PR, the green light-emitting layer 14PG, or the blue light-emitting layer 24CB as in the present embodiment.

Figure 3:
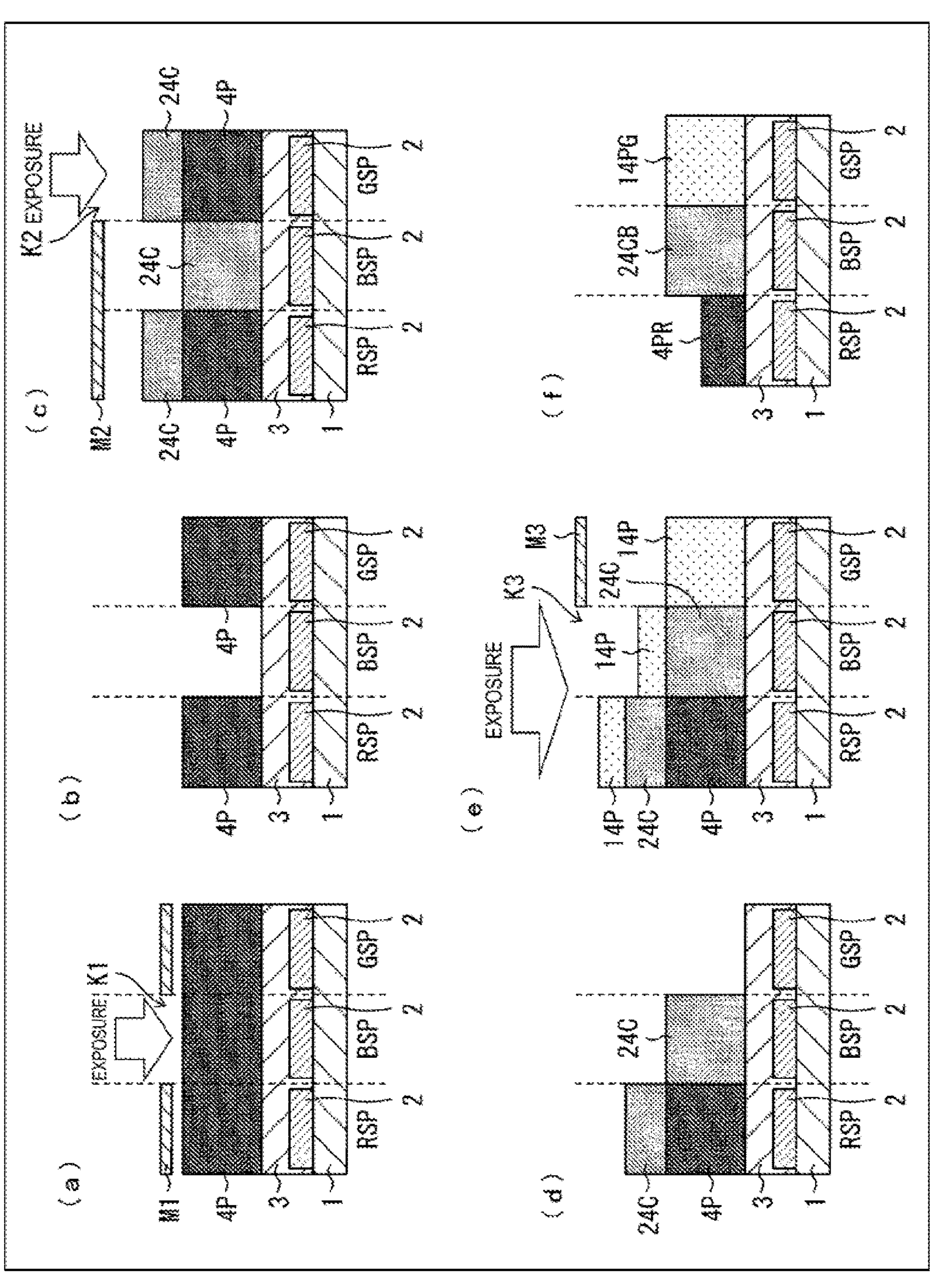
In FIG. 3, (a), (b), (c), (d), (e), and (f) are diagrams each of which illustrates a part of a manufacturing process of the display device according to the first embodiment.

Each of (a) of FIG. 3, (b) of FIG. 3, (c) of FIG. 3, (d) of FIG. 3, (e) of FIG. 3, and (f) of FIG. 3 is a diagram illustrating a part of the manufacturing process of the display device 30.

Figure 4:
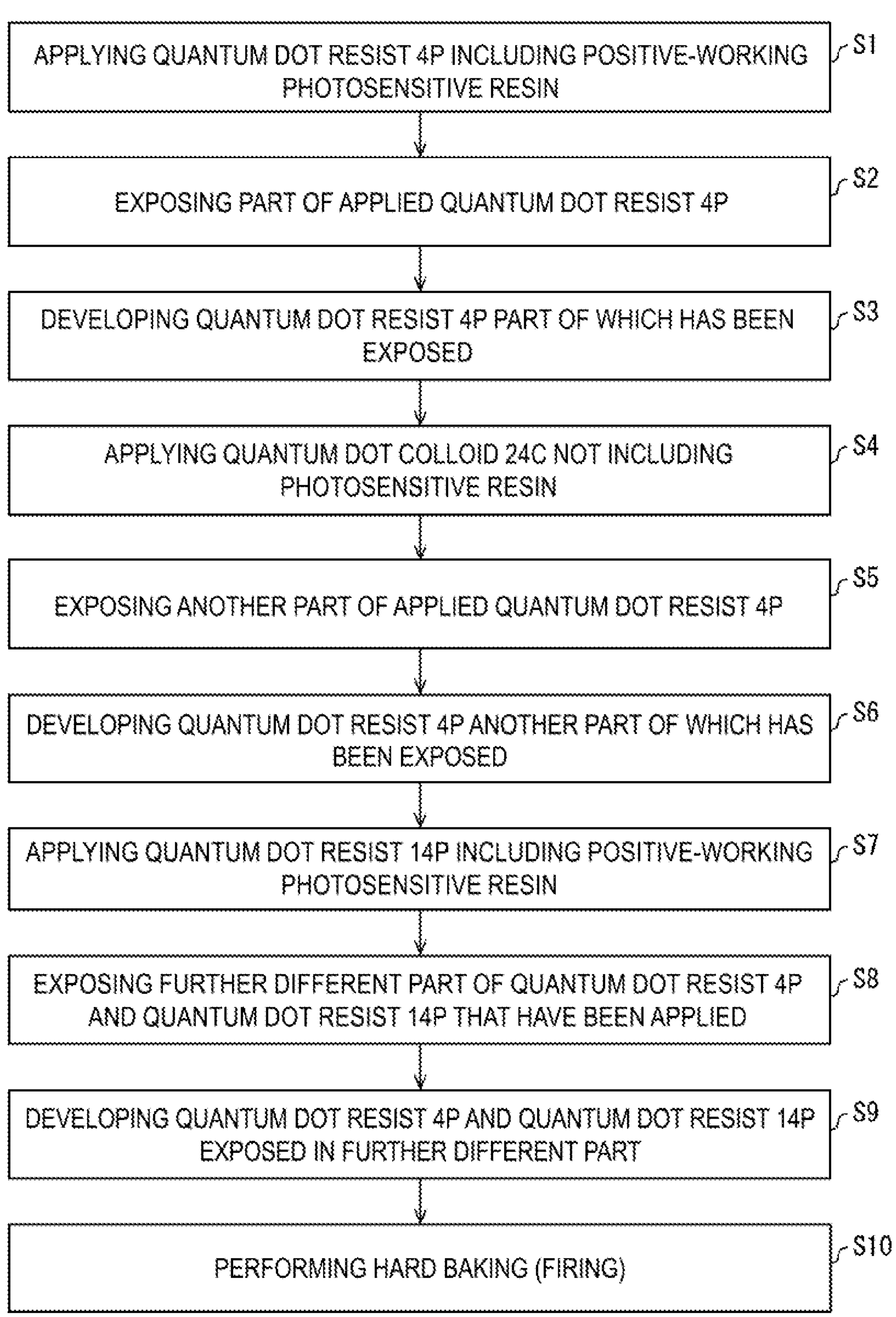
FIG. 4 is a diagram for describing a part of the manufacturing process of the display device according to the first embodiment.

FIG. 4 is a diagram for describing a part of the manufacturing process of the display device 30.

(a) of FIG. 3 is a diagram illustrating a state after a step of applying a quantum dot resist 4P including a positive-working photosensitive resin onto the hole transport layer 3 provided so as to cover the anode 2 provided in each of the red subpixel RSP, the blue subpixel BSP, and the green subpixel GSP on the substrate 1 (step S1 in FIG. 4) and a step of exposing a part of the applied quantum dot resist 4P (step S2 in FIG. 4). As illustrated in (a) of FIG. 3, the quantum dot resist 4P (first solution) that is a solution obtained by dispersing a positive-working photosensitive resin, a quantum dot (QD) (a first core) that emits red light, and a polar ligand (a first ligand) around the quantum dot (QD) in PGMEA that is a polar solvent is applied onto the entire surface of the hole transport layer 3, that is, to portions corresponding to the red subpixel RSP, the blue subpixel BSP, and the green subpixel GSP. The quantum dot resist 4P can be applied by using, for example, a spin coating method or a bar coating method. Then, by using a mask M1 including an opening K1 at a portion corresponding to the blue subpixel BSP, the portion of the applied quantum dot resist 4P corresponding to the blue subpixel BSP is exposed.

(b) of FIG. 3 is a diagram illustrating a state after performing a step of developing the partially exposed quantum dot resist 4P (step S3 in FIG. 4). As illustrated in (b) of FIG. 3, the portion corresponding to the blue subpixel BSP can be removed by developing the portion corresponding to the blue subpixel BSP that is the exposed portion in a film formed by applying the quantum dot resist 4P. Note that although omitted in the present embodiment, after the development, a step of soft baking (a step of temporarily baking) that is a step of heat treatment at a relatively low temperature and that is to be performed for a relatively short time may be performed as necessary. Step S1 to step S3 in FIG. 4 are steps of forming the quantum dot resist 4P (steps of forming a first light-emitting layer), and step S2 and step S3 in FIG. 4 are steps of patterning the quantum dot resist 4P (steps of first patterning).

(c) of FIG. 3 is a diagram illustrating a state after performing a step of applying a quantum dot colloid 24C (step S4 in FIG. 4) that does not include a photosensitive resin and a step of exposing another part of the applied quantum dot resist 4P (step S5 in FIG. 4). As illustrated in (c) of FIG. 3, the quantum dot colloid 24C (second solution) that is a solution not including a photosensitive resin, the solution being obtained by dispersing a quantum dot (QD) (second core) that emits blue light and a non-polar ligand (second ligand) around the quantum dot (QD) in octane that is a non-polar solvent, is applied to the entire surface, that is, the portion corresponding to the red subpixel RSP, the portion corresponding to the blue subpixel BSP, and the portion corresponding to the green subpixel GSP. Thus, octane that is the non-polar solvent comes into contact with the applied quantum dot resist 4P. Additionally, a position where octane that is the non-polar solvent comes into contact with the applied quantum dot resist 4P includes a light-emitting region in the display region DA. The quantum dot colloid 24C can be applied by using, for example, a spin coating method or a bar coating method.

Note that in this step, the applied quantum dot resist 4P comes into contact with octane that is the non-polar solvent included in the quantum dot colloid 24C, but the first light-emitting material included in the quantum dot resist 4P is unlikely to be dissolved by octane that is the non-polar solvent included in the quantum dot colloid 24C. That is, color mixing is unlikely to occur. This is because of the following reasons.

The first light-emitting material of the quantum dot resist 4P becomes a polar material (polar molecules) due to the influence of the polar ligand around the quantum dot (QD), and thus, is easily dissolved in polar solvents but is hardly dissolved in non-polar solvents. On the other hand, the second light-emitting material of the quantum dot colloid 24C becomes a non-polar material (non-polar molecules) due to the influence of the non-polar ligand around the quantum dot (QD), and thus, is easily dissolved in non-polar solvents but is hardly dissolved in polar solvents. Accordingly, in the present embodiment, since the first light-emitting material included in the quantum dot resist 4P is a polar material, PGMEA, which is a polar solvent, is used as a solvent for the quantum dot resist 4P, and since the second light-emitting material included in the quantum dot colloid 24C is a non-polar material, octane, which is a non-polar solvent, is used as a solvent for the quantum dot colloid 24C. As a result, a solubility of the first light-emitting material that is a polar material for octane, which is a non-polar solvent, is less than a solubility of the first light-emitting material that is a polar material for PGMEA, which is a polar solvent.

Thereafter, as illustrated in (c) of FIG. 3, a portion of the applied quantum dot resist 4P corresponding to the green subpixel GSP is exposed by using a mask M2 including an opening K2 at the portion corresponding to the green subpixel GSP.

(d) of FIG. 3 is a diagram illustrating a state after performing a step of developing the quantum dot resist 4P of which another part has been exposed (step S6 in FIG. 4). That is, a portion corresponding to the green subpixel GSP of a first layered film in which the film formed by applying the quantum dot resist 4P and the film formed by applying the quantum dot colloid 24C have been layered is exposed and developed to remove the portion corresponding to the green subpixel GSP of the first layered film (a step of second patterning). Note that although omitted in the present embodiment, after the development, a step of soft baking that is a step of heat treatment at a relatively low temperature and that is to be performed for a relatively short time may be performed as necessary. Step S4 to step S6 in FIG. 4 are steps of forming the quantum dot colloid 24C (steps of forming a second light-emitting layer), and step S5 and step S6 in FIG. 4 are steps of patterning the quantum dot colloid 24C (steps of second patterning).

(e) of FIG. 3 is a diagram illustrating a state after performing a step of applying a quantum dot resist 14P including a positive-working photosensitive resin (step S7 in FIG. 4) and a step of exposing a further different part of the quantum dot resist 4P and the quantum dot resist 14P that have been applied (step S8 in FIG. 4). As illustrated in (e) of FIG. 3, the quantum dot resist 14P (third solution) that is a solution obtained by dispersing a positive-working photosensitive resin, a quantum dot (QD) (a third core) that emits green light, and a polar ligand (a third ligand) around the quantum dot (QD) in PGMEA, which is a polar solvent, is applied onto the entire surface, that is, to the portion corresponding to the red subpixel RSP, the portion corresponding to the blue subpixel BSP, and the portion corresponding to the green subpixel GSP. Thus, PGMEA, which is the polar solvent, comes into contact with the applied quantum dot colloid 24C. Moreover, a position where PGMEA, which is the polar solvent, comes into contact with the applied quantum dot colloid 24C includes a light-emitting region in the display region DA. The quantum dot resist 14P can be applied by using, for example, a spin coating method or a bar coating method.

Note that in this step, the applied quantum dot resist 14P comes into contact with the applied quantum dot colloid 24C, but the second light-emitting material included in the quantum dot colloid 24C is hardly dissolved by PGMEA serving as the polar solvent included in the quantum dot resist 14P. That is, color mixing is unlikely to occur. On the other hand, in this step, since the applied quantum dot colloid 24C is provided between the applied quantum dot resist 14P and the applied quantum dot resist 4P, the applied quantum dot resist 14P can be minimized to be in contact with the applied quantum dot resist 4P.

Thereafter, as illustrated in (e) of FIG. 3, the portions of the applied quantum dot resist 4P and the applied quantum dot resist 14P corresponding to the red subpixel RSP and the blue subpixel BSP, respectively, are exposed by using a mask M3 including an opening K3 at the portions corresponding to the red subpixel RSP and the blue subpixel BSP.

(f) of FIG. 3 is a diagram illustrating a state after performing a step of developing the quantum dot resist 4P and the quantum dot resist 14P exposed in the further different part (step S9 in FIG. 4) and a step of hard baking (firing) (step S10 in FIG. 4). Note that although omitted in the present embodiment, after the development, a step of soft baking that is a step of heat treatment at a relatively low temperature and that is to be performed for a relatively short time may be performed as necessary. Step S7 to step S9 in FIG. 4 are steps of forming the quantum dot resist 14P (steps of forming a third light-emitting layer).

By exposing and developing a portion corresponding to the red subpixel RSP of a second layered film obtained by layering the film formed by applying the quantum dot resist 4P, the film formed by applying the quantum dot colloid 24C, and the film formed by applying the quantum dot resist 14P and a portion corresponding to the blue subpixel BSP of a third layered film obtained by layering the film formed by applying the quantum dot colloid 24C and the film formed by applying the quantum dot resist 14P, a red light-emitting layer 4PR can be formed in the red subpixel RSP (first region), a blue light-emitting layer 24CB can be formed in the blue subpixel BSP (second region), and a green light-emitting layer 14PG can be formed in the green subpixel GSP (third region). That is, the red light-emitting layer 4PR (first light-emitting layer) that emits red light (first color), the blue light-emitting layer 24CB (second light-emitting layer) that emits blue light (second color), and the green light-emitting layer 14PG (third light-emitting layer) that emits green light (third color) emit light in different regions.

The reason why a height of the red light-emitting layer 4PR illustrated in (f) of FIG. 3 is lower than a height of the quantum dot resist 4P illustrated in (e) of FIG. 3 is that the quantum dot colloid 24C formed on the quantum dot resist 4P is non-photosensitive in the red subpixel RSP as illustrated in (e) of FIG. 3. In order to remove the quantum dot colloid 24C that is non-photosensitive, it is necessary to expose and develop a part of the lower layer that is photosensitive, that is, the quantum dot resist 4P.

After that, in the present embodiment, hard baking (firing) is separately performed, but no such limitation is intended. For example, hard baking of the red light-emitting layer 4PR, the blue light-emitting layer 24CB, and the green light-emitting layer 14PG may be performed together with hard baking of a film formed in a subsequent step.

Note that although not illustrated in FIG. 3 and FIG. 4, the display device 30 can be manufactured by subsequently performing a step of forming the electron transport layer 5 and a step of forming the cathode 6.

As described above, in the manufacturing process of the display device 30, the blue light-emitting layer 24CB is formed by using the quantum dot colloid 24C (second solution) including the second light-emitting material that is a non-polar material, and octane, which is a non-polar solvent, in which a solubility of the first light-emitting material that is a polar material is less than a solubility of the first light-emitting material that is a polar material, in PGMEA, which is a polar solvent. Thus, the first light-emitting material that is the polar material included in the quantum dot resist 4P applied in advance is less likely to be dissolved by octane that is the non-polar solvent included in the quantum dot colloid 24C. Accordingly, hard baking (firing) does not need to be performed for each process of forming each light-emitting layer, which achieves the method for manufacturing the display device with high productivity and the display device. Furthermore, since it is not necessary to perform hard baking for each process of forming each light-emitting layer, thermal degradation of the light-emitting layer can also be suppressed.

Figure 17:
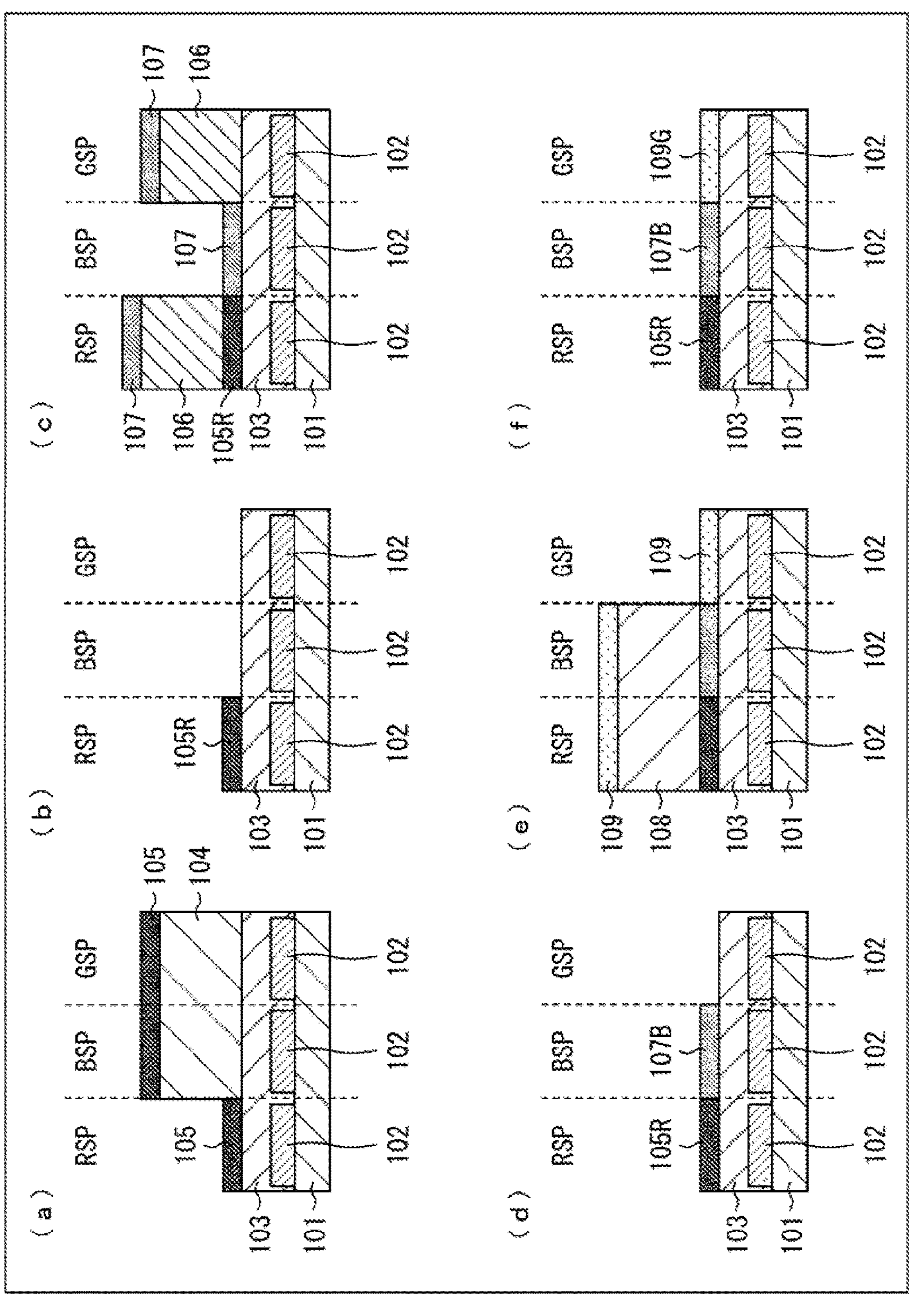
In FIG. 17, (a), (b), (c), (d), (e) and (f) are diagrams for describing problems in a manufacturing process of a display device by using a known lift-off method.

(a) of FIG. 17, (b) of FIG. 17, (c) of FIG. 17, (d) of FIG. 17, (e) of FIG. 17, and (f) of FIG. 17 are diagrams for describing problems in the manufacturing process of the display device by using the known lift-off method.

As illustrated in (a) of FIG. 17, first, a positive-working resist 104 is formed on the entire surface of the hole transport layer 103 provided so as to cover the anode 102 provided in each of the subpixels RSP, BSP, and GSP of each color on the substrate 101. Thereafter, only a region corresponding to the red subpixel RSP of the positive-working resist 104 is exposed and developed, so that the resist 104 is left only in regions corresponding to the blue subpixel BSP and the green subpixel GSP. Then, a quantum dot colloid 105 including a quantum dot (QD) that emits red light and not including a photosensitive resin is formed on the entire surface. After that, the positive-working resist 104 is exposed.

Then, as illustrated in (b) of FIG. 17, the exposed resist 104 is peeled off (lifted off) to leave the quantum dot colloid 105 only in the region corresponding to the red subpixel RSP. Thereafter, hard baking (firing) is performed to form the red light-emitting layer 105R.

Then, as illustrated in (c) of FIG. 17, after a positive-working resist 106 is formed on the entire surface, only a region corresponding to the blue subpixel BSP of the positive-working resist 106 is exposed and developed, so that the resist 106 is left only in the regions corresponding to the red subpixel RSP and the green subpixel GSP. Then, a quantum dot colloid 107 including a quantum dot (QD) that emits blue light and not including a photosensitive resin is formed on the entire surface. After that, the positive-working resist 106 is exposed.

Then, as illustrated in (d) of FIG. 17, the exposed resist 106 is peeled off (lifted off) to leave the quantum dot colloid 107 only in the region corresponding to the blue subpixel BSP. Thereafter, hard baking is performed to form a blue light-emitting layer 107B.

Then, as illustrated in (e) of FIG. 17, after the positive-working resist 108 is formed on the entire surface, only the region corresponding to the green subpixel GSP of the positive-working resist 108 is exposed and developed, so that the resist 108 is left only in the regions corresponding to the red subpixel RSP and the blue subpixel BSP. Then, a quantum dot colloid 109 including a quantum dot (QD) that emits green light and not including a photosensitive resin is formed on the entire surface. After that, the positive-working resist 108 is exposed.

Then, as illustrated in (f) of FIG. 17, the exposed resist 108 is peeled off (lifted off) to leave the quantum dot colloid 109 only in the region corresponding to the green subpixel GSP. Thereafter, hard baking (firing) is performed to form the green light-emitting layer 109G.

Since the quantum dot colloid 105, the quantum dot colloid 107, and the quantum dot colloid 109 include the same solvent or the same kind of solvent, it is necessary to perform hard baking for the light-emitting layers of each color.

As described above, in the method for manufacturing the display device by using the known lift-off method, since it is necessary to perform hard baking for the light-emitting layers of each color, there is a problem that the productivity of the display device is remarkably lowered and there is also a problem that the light-emitting layer is thermally deteriorated.

Figure 18:
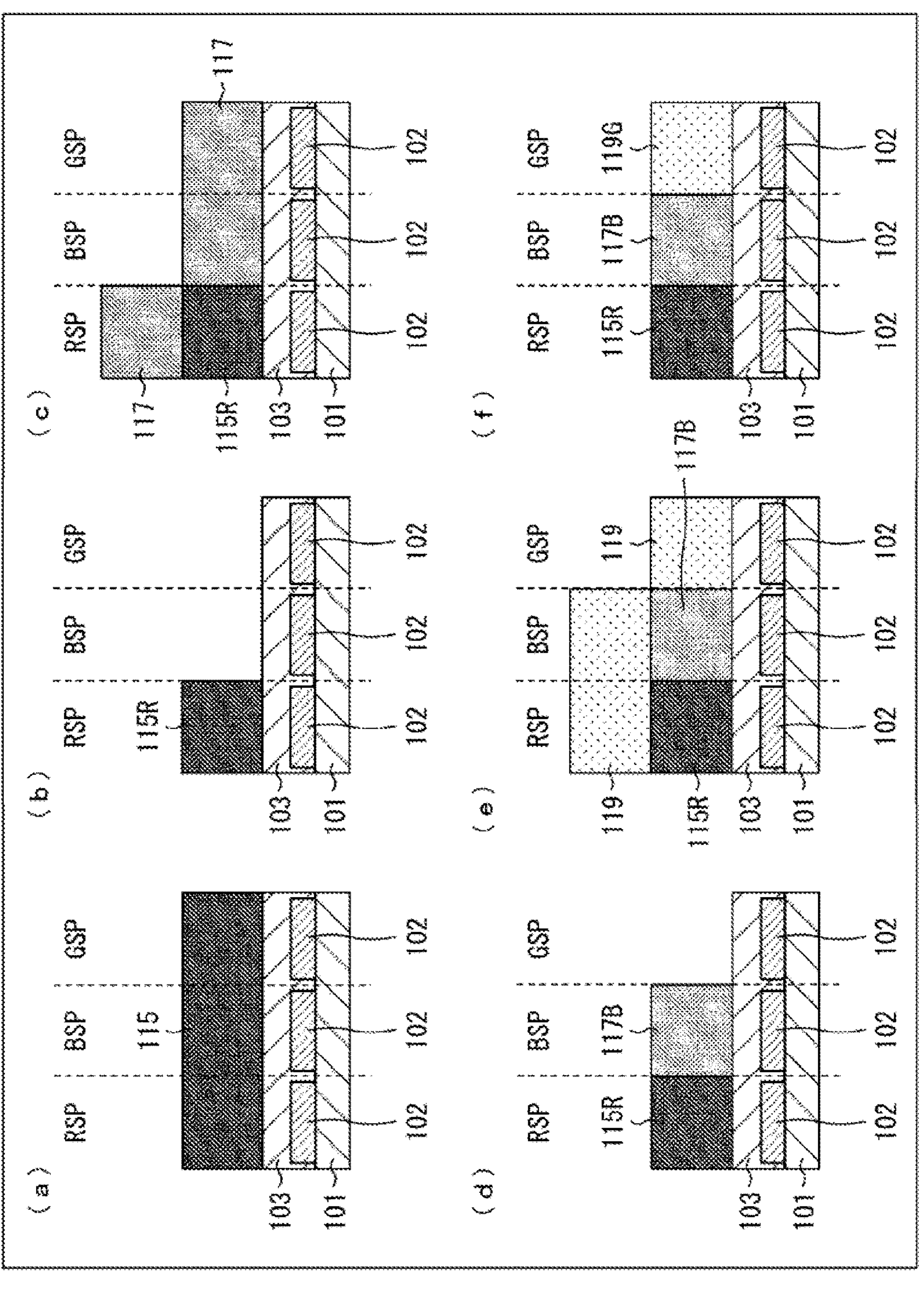
In FIG. 18, (a), (b), (c), (d), (e) and (f) are diagrams for describing problems in a manufacturing process of a display device by using a known photoresist type light-emitting layer.

(a) of FIG. 18, (b) of FIG. 18, (c) of FIG. 18, (d) of FIG. 18, (e) of FIG. 18, and (f) of FIG. 18 are diagrams for describing problems in a manufacturing process of a display device by using a light-emitting layer of a known photoresist type.

As illustrated in (a) of FIG. 18, first, a photoresist type of a red light-emitting material 115 is formed on the entire surface of the hole transport layer 103, the hole transport layer 103 being provided so as to cover the anode 102 provided in each of the subpixels RSP, BSP, and GSP for the respective colors on the substrate 101. Note that here, it is assumed that the red light-emitting material 115 of the photoresist type is a positive type. After that, the region corresponding to the blue subpixel BSP and the region corresponding to the green subpixel GSP of the red light-emitting material 115 of the photoresist type are exposed.

Then, as illustrated in (b) of FIG. 18, the exposed red light-emitting material 115 of the photoresist type is developed so that the red light-emitting material 115 remains only in the region corresponding to the red subpixel RSP. Thereafter, hard baking (firing) is performed to form the red light-emitting layer 115R.

Then, as illustrated in (c) of FIG. 18, a blue light-emitting material 117 of a photoresist type is formed on the entire surface. Note that here, the blue light-emitting material 117 of the photoresist type is a positive type. A region corresponding to the red subpixel RSP and a region corresponding to the green subpixel GSP of the blue light-emitting material 117 of the photoresist type are exposed.

Then, as illustrated in (d) of FIG. 18, the exposed blue light-emitting material 117 of the photoresist type is developed so that the blue light-emitting material 117 remains only at the region corresponding to the blue subpixel BSP. Thereafter, hard baking is performed to form a blue light-emitting layer 117B.

Then, as illustrated in (e) of FIG. 18, a green light-emitting material 119 of a photoresist type is formed on the entire surface. Note that here, it is assumed that the green light-emitting material 119 of the photoresist type is a positive type. A region corresponding to the red subpixel RSP and a region corresponding to the blue subpixel BSP of the green light-emitting material 119 of the photoresist type are exposed.

Then, as illustrated in (f) of FIG. 18, the exposed green light-emitting material 119 of the photoresist type is developed so that the green light-emitting material 119 remains only in the region corresponding to the green subpixel GSP. Thereafter, hard baking is performed to form a green light-emitting layer 119G.

The red light-emitting material 115 of the photoresist type, the blue light-emitting material 117 of the photoresist type, and the green light-emitting material 119 of the photoresist type are in contact with each other in the manufacturing process described above. In addition, the red light-emitting material 115 of the photoresist type, the blue light-emitting material 117 of the photoresist type, and the green light-emitting material 119 of the photoresist type include the same solvent or the same kind of solvent. For these reasons, in the manufacturing process of the display device by using the known photoresist type light-emitting layer, it is necessary to perform hard baking the light-emitting layer of each color.

Thus, the known method for manufacturing the display device by using the light-emitting layer of the photoresist type has a problem that the productivity of the display device is remarkably lowered and a problem that the light-emitting layer is thermally deteriorated.

In the present embodiment, the case where the first light-emitting material included in the quantum dot resist 4P is the quantum dot (QD) that emits red light, the second light-emitting material included in the quantum dot colloid 24C is the quantum dot (QD) that emits blue light, and the third light-emitting material included in the quantum dot resist 14P is the quantum dot (QD) that emits green light has been described, but no such limitation is intended. As long as the first light-emitting material, the second light-emitting material, and the third light-emitting material emit light of different colors, the colors of light to be emitted are not particularly limited.

In the present embodiment, the case where the quantum dot resist 4P that is the first solution includes the first light-emitting material that is the polar material and the polar solvent, the quantum dot colloid 24C that is the second solution includes the second light-emitting material that is the non-polar material and the non-polar solvent, and the quantum dot resist 14P that is the third solution includes the third light-emitting material that is the polar material and the polar solvent has been described as an example, but no such limitation is intended. For example, the quantum dot resist 4P may include a first light-emitting material that is a non-polar material and a non-polar solvent, the quantum dot colloid 24C may include a second light-emitting material that is a polar material and a polar solvent, and the quantum dot resist 14P may include a third light-emitting material that is a non-polar material and a non-polar solvent.

Furthermore, two kinds of light-emitting layers may be formed by using a first solution including a first light-emitting material and a first solvent, and a second solution including a second light-emitting material and a second solvent in which a solubility of the first light-emitting material is less than a solubility of the first light-emitting material in the first solvent. Alternatively, three kinds of light-emitting layers may be formed by using a first solution including a first light-emitting material and a first solvent, a second solution including a second light-emitting material and a second solvent in which a solubility of the first light-emitting material is less than a solubility of the first light-emitting material in the first solvent, and a third solution including a third light-emitting material and a third solvent in which a solubility of the second light-emitting material is less than a solubility of the second light-emitting material in the second solvent.

In the present embodiment, the case where the quantum dot resist 4P including a photosensitive resin, the quantum dot resist 14P including a photosensitive resin, and the quantum dot colloid 24C not including a photosensitive resin are used has been described as an example, but no such limitation is intended. For example, a first quantum dot colloid including a first light-emitting material that is a polar material and that emits red light, and a polar solvent, the first quantum dot colloid not including a photosensitive resin, a second quantum dot colloid including a second light-emitting material that is a non-polar material and that emits blue light, and a non-polar solvent, the second quantum dot colloid not including a photosensitive resin, and a third quantum dot colloid including a third light-emitting material that is a polar material and that emits green light, and a polar solvent, the third quantum dot colloid not including a photosensitive resin may be used. As described above, when only the quantum dot colloid not including a photosensitive resin is used, patterning of each light-emitting layer can be performed by performing steps in which a step of first hard baking and a step of second hard baking are omitted from the steps illustrated in FIG. 17 described above. The reason why the step of the first hard baking and the step of the second hard baking can be omitted is that although the first quantum dot colloid and the non-polar solvent of the second quantum dot colloid that have been applied are in contact with each other, the first light-emitting material that is the polar material included in the applied first quantum dot colloid is hardly dissolved by the non-polar solvent of the second quantum dot colloid. Similarly, the reason is that although the second quantum dot colloid and the polar solvent of the third quantum dot colloid that have been applied are in contact with each other, the second light-emitting material that is the non-polar material included in the applied second quantum dot colloid is hardly dissolved by the polar solvent of the third quantum dot colloid. As described above, even in the case where the display device is manufactured by using only the quantum dot colloid not including a photosensitive resin, it is not necessary to perform hard baking for each process of forming each light-emitting layer. Thus, the method for manufacturing the display device with high productivity and the display device can be achieved. Furthermore, since it is not necessary to perform hard baking for each process of forming each light-emitting layer, thermal degradation of the light-emitting layer can also be suppressed.

Furthermore, for example, a first quantum dot resist including a first light-emitting material that is a polar material and that emits red light, a polar solvent, and a photosensitive resin, a second quantum dot resist including a second light-emitting material that is a non-polar material and that emits blue light, a non-polar solvent, and a photosensitive resin, and a third quantum dot resist including a third light-emitting material that is a polar material and that emits green light, a polar solvent, and a photosensitive resin may be used. As described above, when only a quantum dot resist including a photosensitive resin is used and the photosensitive resin is a positive type, patterning of each light-emitting layer can be performed by performing steps in which the step of the first hard baking and the step of the second hard baking are omitted from the steps illustrated in FIG. 18. The reason why the step of the first hard baking and the step of the second hard baking can be omitted is that although the applied first quantum dot resist and the non-polar solvent of the second quantum dot resist are in contact with each other, the first light-emitting material that is the polar material included in the applied first quantum dot resist is hardly dissolved by the non-polar solvent of the second quantum dot resist. Similarly, the reason is that although the applied second quantum dot resist and the polar solvent of the third quantum dot resist are in contact with each other, the second light-emitting material that is the non-polar material included in the applied second quantum dot resist is hardly dissolved by the polar solvent of the third quantum dot resist. As described above, even when a display device is manufactured by using only a quantum dot resist including a photosensitive resin, it is not necessary to perform hard baking for each process of forming each light-emitting layer. Thus, the method for manufacturing a display device with high productivity and the display device can be achieved. Furthermore, since it is not necessary to perform hard baking for each process of forming each light-emitting layer, thermal degradation of the light-emitting layer can also be suppressed.

In the present embodiment, the case where the first light-emitting material included in the quantum dot resist 4P serving as the first solution includes the quantum dot (QD) that emits red light and the polar ligand, the second light-emitting material included in the quantum dot colloid 24C serving as the second solution includes the quantum dot (QD) that emits blue light and the non-polar ligand, and the third light-emitting material included in the quantum dot resist 14P serving as the third solution includes the quantum dot (QD) that emits green light and the polar ligand has been described as an example, but no such limitation is intended. For example, the first light-emitting material may be constituted by polar molecules, the second light-emitting material may be constituted by non-polar molecules, and the third light-emitting material may be constituted by polar molecules. Further, the first solvent may be a non-polar solvent and the first light-emitting material may be constituted by non-polar molecules, the second solvent may be a polar solvent and the second light-emitting material may be constituted by polar molecules, the third solvent may be a non-polar solvent and the third light-emitting material may be constituted by non-polar molecules. Furthermore, each of the first light-emitting material, the second light-emitting material, and the third light-emitting material may be an organic material.

In the present embodiment, for example, the case where propylene glycol monomethyl ether acetate (PGMEA) is used as the polar solvent has been described as an example. However, the polar solvent is not limited thereto, and for example, water, ethanol, isopropanol, methanol, n-butanol, or the like may be used. Additionally, although the case where octane is used as the non-polar solvent has been described as an example, the non-polar solvent is not limited thereto, and for example, hexane or toluene may be used as the non-polar solvent.

Furthermore, a difference between a Hildebrand solubility parameter δ (an SP value) of the first solvent and a Hildebrand solubility parameter δ (an SP value) of the second solvent in which a solubility of the first light-emitting material is less than a solubility of the first light-emitting material in the first solvent is preferably equal to or greater than 0.1, more preferably equal to or greater than 0.2, still more preferably equal to or greater than 0.3, particularly preferably equal to or greater than 0.4, and most preferably equal to or greater than 0.5. Note that the Hildebrand solubility parameter δ (the SP value) is a physical property value defined by the square root of a cohesive energy density, and is a numerical value indicating the dissolution behavior of a solvent. The Hildebrand solubility parameter δ (SP value) is divided into three terms, which are a dispersion force term (δD), a polarity term (δP), and a hydrogen bonding term (δH), and the solubility parameter in consideration of the polarity of a substance is a Hansen solubility parameter (an HSP value). A relationship between the Hildebrand solubility parameter δ (the SP value) and the Hansen solubility parameter (the HSP value) satisfies $\delta^2=\delta D^2+\delta P^2+\delta H^2$. The closer the HSP value (δD, δP, δH) of a target substance, that is, a position on XYZ coordinates, and the HSP value (δD, δP, δH) of a solvent, that is, a position on XYZ coordinates are, the more easily the target substance is dissolved in the solvent. In the present embodiment, on the XYZ coordinates, the HSP value (δD, δP, δH) of the first solvent is closer to the HSP value (δD, δP, δH) of the first light-emitting material that is the target substance than the HSP value (δD, δP, δH) of the second solvent. Thus, the first light-emitting material is more easily dissolved in the first solvent than in the second solvent. In addition, a difference between the Hildebrand solubility parameter δ (the SP value) of the first solvent and the Hildebrand solubility parameter δ (the SP value) of the second solvent that exhibits such dissolution behavior is preferably equal to or greater than 0.1. For example, first, a first solvent and a second solvent that have a difference in Hildebrand solubility parameter δ (SP value) therebetween being equal to or greater than 0.1 are selected, and then, a ligand of the first light-emitting material or a polarity of a molecule of the first light-emitting material may be appropriately selected so that the first light-emitting material is more easily dissolved in the first solvent than in the second solvent. The Hildebrand solubility parameter δ (the SP value) of the first light-emitting material is preferably different from the Hildebrand solubility parameter δ (the SP value) of the second light-emitting material by a value being equal to or greater than 0.1. Furthermore, differences between the Hildebrand solubility parameters δ (the SP values) of the first solvent and the third solvent and the Hildebrand solubility parameter δ (the SP value) of the second solvent are preferably equal to or greater than 0.1. Note that, for example, it is known that the SP value of PGMEA is 8.7, the SP value of octane is 7.6, the SP value of hexane is 7.3, and the SP value of toluene is 8.8.

In the present embodiment, as described above with reference to FIG. 3 and FIG. 4, the case where the quantum dot colloid 24C is applied by using, for example, a spin coating method or a bar coating method has been described, but no such limitation is intended. For example, PGMEA (the SP value=8.7), which is a polar solvent, can be used as the first solvent included in the quantum dot resist 4P that is the first solution, and for example, water (the SP value=23.4), ethanol (the SP value=12.7), isopropanol (the SP value=11.5), methanol (the SP value=14.5 to 14.8), or n-butanol (the SP value=11.3), which is a polar solvent, can be used as the third solvent included in the quantum dot resist 14P that is the third solution. When a solubility of the first light-emitting material in the third solvent included in the quantum dot resist 14P that is the third solution is less than a solubility of the first light-emitting material in the first solvent included in the quantum dot resist 4P that is the first solution, as in the case where the SP value of the first light-emitting material is closer to the SP value of PGMEA that is the first solvent than to the SP value of the third solvent, and the SP value of the third light-emitting material is closer to the SP value of the third solvent than to the SP value of PGMEA that is the first solvent, the quantum dot colloid 24C may be formed by an ink-jet method. When the quantum dot colloid 24C illustrated in (c) of FIG. 3 is formed by the ink-jet method, that is, when the quantum dot colloid 24C is dropped onto the portion corresponding to the blue subpixel BSP, the quantum dot colloid 24C is formed only at the blue subpixel BSP, and thus, in the step of applying the quantum dot resist 14P illustrated in (e) of FIG. 3, the applied quantum dot resist 4P comes into contact with the third solvent included in the quantum dot resist 14P in the red subpixel RSP. Accordingly, a solubility of the first light-emitting material in the third solvent included in the quantum dot resist 14P that is the third solvent needs to be less than a solubility of the first light-emitting material in the first solvent included in the quantum dot resist 4P that is the first solution. In this manner, by manufacturing a display device by combining the photolithography method with relatively high definition and the ink-jet method with relatively low definition, a display device with high definition can be manufactured as compared with a case where a display device is manufactured only by an ink-jet method.

Second Embodiment

Next, a second embodiment of the disclosure will be described with reference to FIG. 5 and FIG. 6. A display device according to the present embodiment is different from the display device described in the first embodiment in that a bank BK covering an edge portion of the anode 2 provided in each of the subpixels RSP, GSP, and BSP of the respective colors on the substrate 1 is provided. The others are as described in the first embodiment. For convenience of description, members having the same functions as those illustrated in diagrams of the first embodiment are denoted by the same reference signs, and descriptions thereof are omitted.

Figure 5:
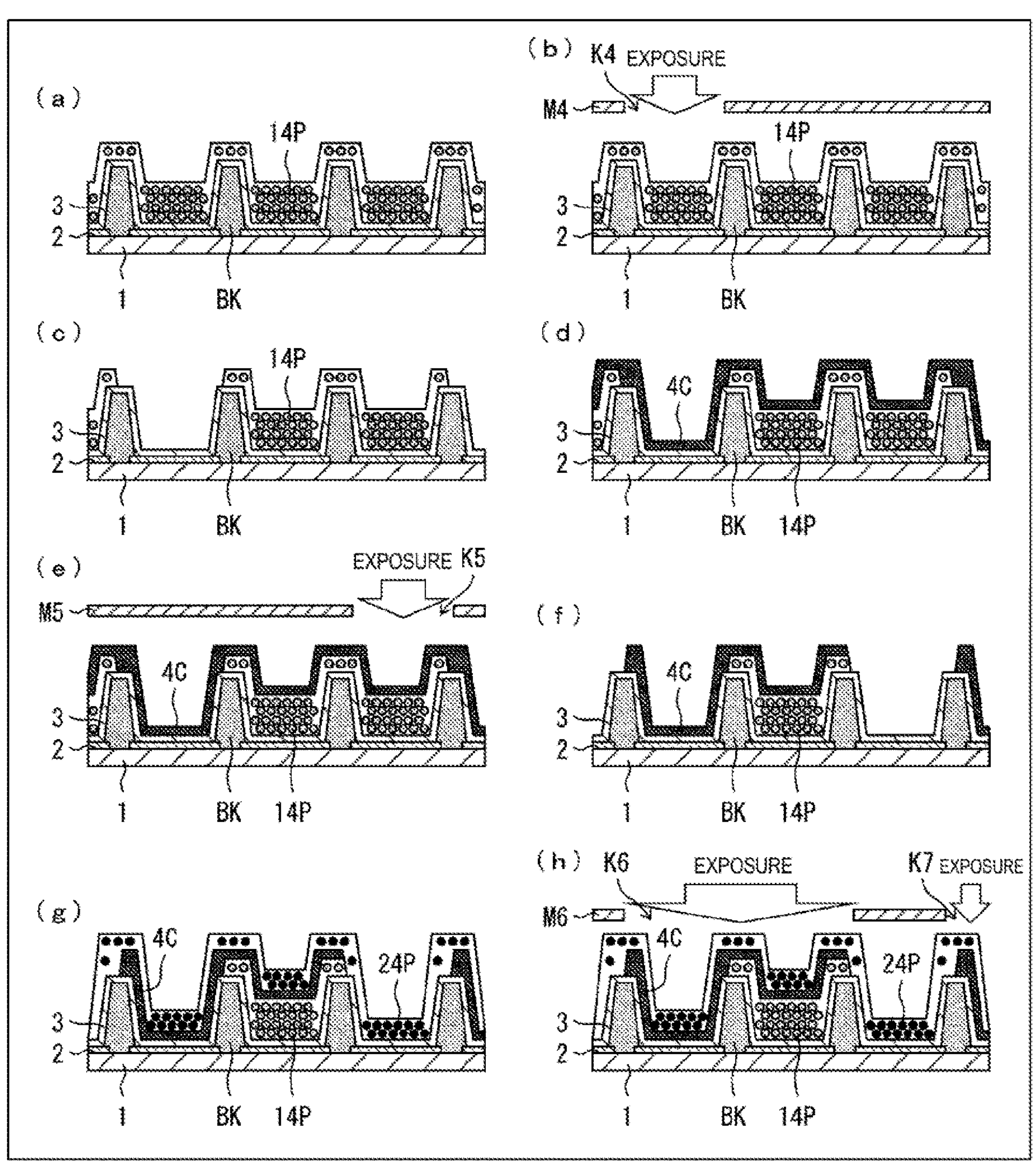
In FIG. 5, (a), (b), (c), (d), (e), (f), (g), and (h) are diagrams each of which illustrates a part of a manufacturing process of a display device according to a second embodiment.

Each of (a) of FIG. 5, (b) of FIG. 5, (c) of FIG. 5, (d) of FIG. 5, (e) of FIG. 5, (f) of FIG. 5. (g) of FIG. 5, and (h) of FIG. 5 is a diagram illustrating a part of a manufacturing process of a display device according to the second embodiment.

Figure 6:
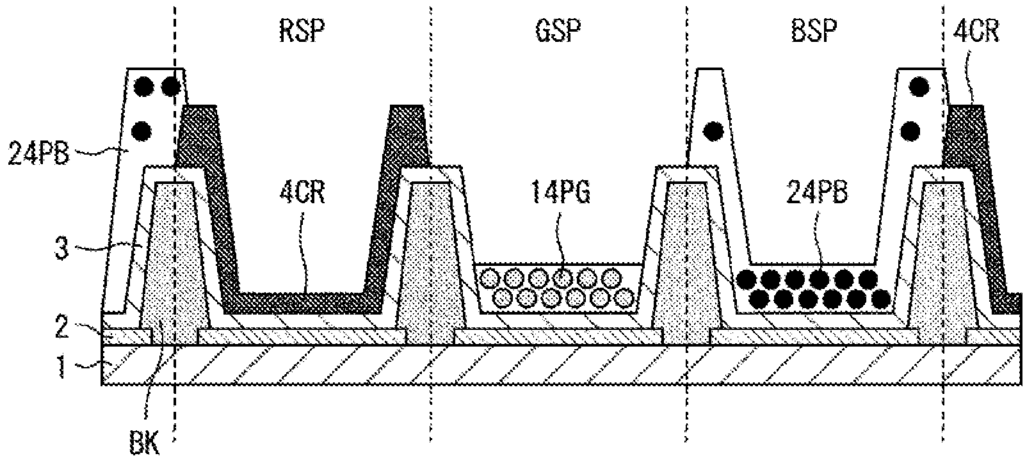
FIG. 6 is a cross-sectional view illustrating a schematic configuration of a part of the display device according to the second embodiment.

FIG. 6 is a cross-sectional view illustrating a schematic configuration of a part of the display device according to the second embodiment.

In the present embodiment, a case where the green light-emitting layer 14PG is formed by using the quantum dot resist 14P (a first solution) that a the solution obtained by dispersing a positive-working photosensitive resin, a quantum dot (QD) that emits green light and that serves as a first light-emitting material, and a polar ligand around the quantum dot (QD) in propylene glycol monomethyl ether acetate (PGMEA) that is a polar solvent serving as a first solvent, the red light-emitting layer 4CR is formed by using the quantum dot colloid 4C (a second solution) that is a solution not including a photosensitive resin, the solution being obtained by dispersing a quantum dot (QD) that emits red light and that serves as a second light-emitting material, and a non-polar ligand around the quantum dot (QD) in octane that is a non-polar solvent serving as a second solvent, and the blue light-emitting layer 24PB is formed by using the quantum dot resist 24P (a third solution) that is a solution obtained by dispersing a positive-working photosensitive resin, a quantum dot (QD) that emits blue light and that serves as a third light-emitting material, and a polar ligand around the quantum dot (QD) in PGMEA that is a polar solvent serving as a third solvent will be described as an example, but no such limitation is intended.

As illustrated in (a) of FIG. 5, the anode 2 provided for each of the subpixels RSP, GSP, and BSP of the respective colors (see FIG. 6), a bank BK covering an edge portion of the anode 2, and the hole transport layer 3 covering the anode 2 and the bank BK are provided on the substrate 1. The quantum dot resist 14P (first solution) is applied onto the entire surface of the hole transport layer 3, that is, a portion corresponding to the red subpixel RSP, a portion corresponding to the blue subpixel BSP, and a portion corresponding to the green subpixel GSP. The quantum dot resist 14P can be applied by using, for example, a spin coating method or a bar coating method. Thereafter, as illustrated in (b) of FIG. 5, the portion of the applied quantum dot resist 14P corresponding to the red subpixel RSP is exposed by using a mask M4 including an opening K4 at the portion corresponding to the red subpixel RSP. Then, as illustrated in (c) of FIG. 5, the portion corresponding to the red subpixel RSP that is the exposed portion of a film formed by applying the quantum dot resist 14P is developed, thereby removing the portion corresponding to the red subpixel RSP. Note that although omitted in the present embodiment, after the development, a step of soft baking (a step of temporarily baking) that is a step of heat treatment at a relatively low temperature and that is to be performed for a relatively short time may be performed as necessary. Thereafter, as illustrated in (d) of FIG. 5, the quantum dot colloid 4C (the second solution) is applied onto the entire surface, that is, the portion corresponding to the red subpixel RSP, the portion corresponding to the blue subpixel BSP, and the portion corresponding to the green subpixel GSP. Thus, octane that is the non-polar solvent included in the quantum dot colloid 4C comes into contact with the applied quantum dot resist 14P. Additionally, a position where octane that is the non-polar solvent comes into contact with the applied quantum dot resist 14P includes the light-emitting region in the display region DA. The quantum dot colloid 4C can be applied by using, for example, a spin coating method or a bar coating method. Note that in this step, the applied quantum dot resist 14P comes into contact with octane that is the non-polar solvent included in the quantum dot colloid 4C, but the first light-emitting material included in the quantum dot resist 14P is hardly dissolved by octane that is the non-polar solvent included in the quantum dot colloid 4C. That is, color mixing is unlikely to occur.

Thereafter, as illustrated in (e) of FIG. 5, the portion of the applied quantum dot resist 14P corresponding to the blue subpixel BSP is exposed by using a mask M5 including an opening K5 at the portion corresponding to the blue subpixel BSP. That is, the portion corresponding to the blue subpixel BSP of a first layered film obtained by layering a film formed by applying the quantum dot resist 14P and a film formed by applying the quantum dot colloid 4C is exposed. Then, as illustrated in (f) of FIG. 5, a portion of the first layered film corresponding to the blue subpixel BSP is removed by development. Note that although omitted in the present embodiment, after the development, a step of soft baking that is a step of heat treatment at a relatively low temperature and that is to be performed for a relatively short time may be performed as necessary.

Thereafter, as illustrated in (g) of FIG. 5, the quantum dot resist 24P (the third solution) is applied onto the entire surface, that is, the portion corresponding to the red subpixel RSP, the portion corresponding to the blue subpixel BSP, and the portion corresponding to the green subpixel GSP. Thus, PGMEA that is the polar solvent included in the quantum dot resist 24P comes into contact with the applied quantum dot colloid 4C. In addition, a position where PGMEA that is the polar solvent comes into contact with the applied quantum dot colloid 4C includes the light-emitting region in the display region DA. The quantum dot resist 24P can be applied by using, for example, a spin coating method or a bar coating method. Note that in this step, the applied quantum dot resist 24P comes into contact with the applied quantum dot colloid 4C, but the second light-emitting material included in the quantum dot colloid 4C is hardly dissolved by PGMEA that is the polar solvent included in the quantum dot resist 24P. That is, color mixing is unlikely to occur. On the other hand, in this process, since the applied quantum dot colloid 4C is present between the applied quantum dot resist 24P and the applied quantum dot colloid 14P, the applied quantum dot colloid 24P can minimize contact with the applied quantum dot resist 14P.

Thereafter, as illustrated in (h) of FIG. 5, the portions of the applied quantum dot resist 24P and the applied quantum dot resist 14P respectively corresponding to the red subpixel RSP and the green subpixel GSP are exposed by using a mask M6 including openings K6 and K7 at the portions corresponding to the red subpixel RSP and the green subpixel GSP, respectively. That is, a portion corresponding to the green subpixel GSP of a second layered film obtained by layering the film formed by applying the quantum dot resist 14P, the film formed by applying the quantum dot colloid 4C, and the film formed by applying the quantum dot resist 24P and a portion corresponding to the red subpixel RSP of a third layered film obtained by layering the film formed by applying the quantum dot colloid 4C and the film formed by applying the quantum dot resist 24P are exposed.

Then, by development, as illustrated in FIG. 6, the red light-emitting layer 4CR can be formed in the red subpixel RSP, the blue light-emitting layer 24PB can be formed in the blue subpixel BSP, and the green light-emitting layer 14PG can be formed in the green subpixel GSP. That is, each of the red light-emitting layer 4CR, the blue light-emitting layer 24PB, and the green light-emitting layer 14PG emits light in a different region. Note that although omitted in the present embodiment, after the development, a step of soft baking that is a step of heat treatment at a relatively low temperature and that is to be performed for a relatively short time may be performed as necessary.

The reason why a height of the green light-emitting layer 14PG illustrated in FIG. 6 is lower than a height of the quantum dot resist 14P illustrated in (h) of FIG. 5 is that the quantum dot colloid 4C formed on the quantum dot resist 14P is non-photosensitive in the green subpixel GSP as illustrated in (h) of FIG. 5. In order to remove the quantum dot colloid 4C that is non-photosensitive, it is necessary to expose and develop a part of the lower layer that is photosensitive, that is, a part of the quantum dot resist 14P.

After that, in the present embodiment, hard baking (firing) is separately performed, but no such limitation is intended. For example, hard baking of the red light-emitting layer 4CR, the blue light-emitting layer 24PB, and the green light-emitting layer 14PG may be performed together with hard baking of a film formed in a subsequent process.

As described above, in the manufacturing process of the display device according to the present embodiment, the red light-emitting layer 4CR is formed by using the quantum dot colloid 4C (the second solution) including the second light-emitting material that is the non-polar material, and octane that is the non-polar solvent and in which a solubility of the first light-emitting material that is the polar material is less than a solubility of the first light-emitting material that is the polar material in PGMEA that is the polar solvent. Thus, the first light-emitting material that is the polar material included in the quantum dot resist 14P applied in advance is less likely to be dissolved by octane that is the non-polar solvent included in the quantum dot colloid 4C, and thus, hard baking (firing) does not need to be performed for each process of forming each light-emitting layer. Accordingly, the method for manufacturing the display device with high productivity and the display device can be achieved. Furthermore, since it is not necessary to perform hard baking for each process of forming each light-emitting layer, thermal degradation of the light-emitting layer can also be suppressed.

Third Embodiment

Next, a third embodiment of the disclosure will be described with reference to FIG. 7. A method for manufacturing a display device according to the present embodiment is different from the method for manufacturing the display device described in each of the first and second embodiments in that a peeling layer 5 is used. The others are as described in the first and second embodiments. For convenience of description, members having the same functions as the members illustrated in the diagrams in the first and second embodiments are denoted by the same reference signs, and descriptions thereof will be omitted.

Figure 7:
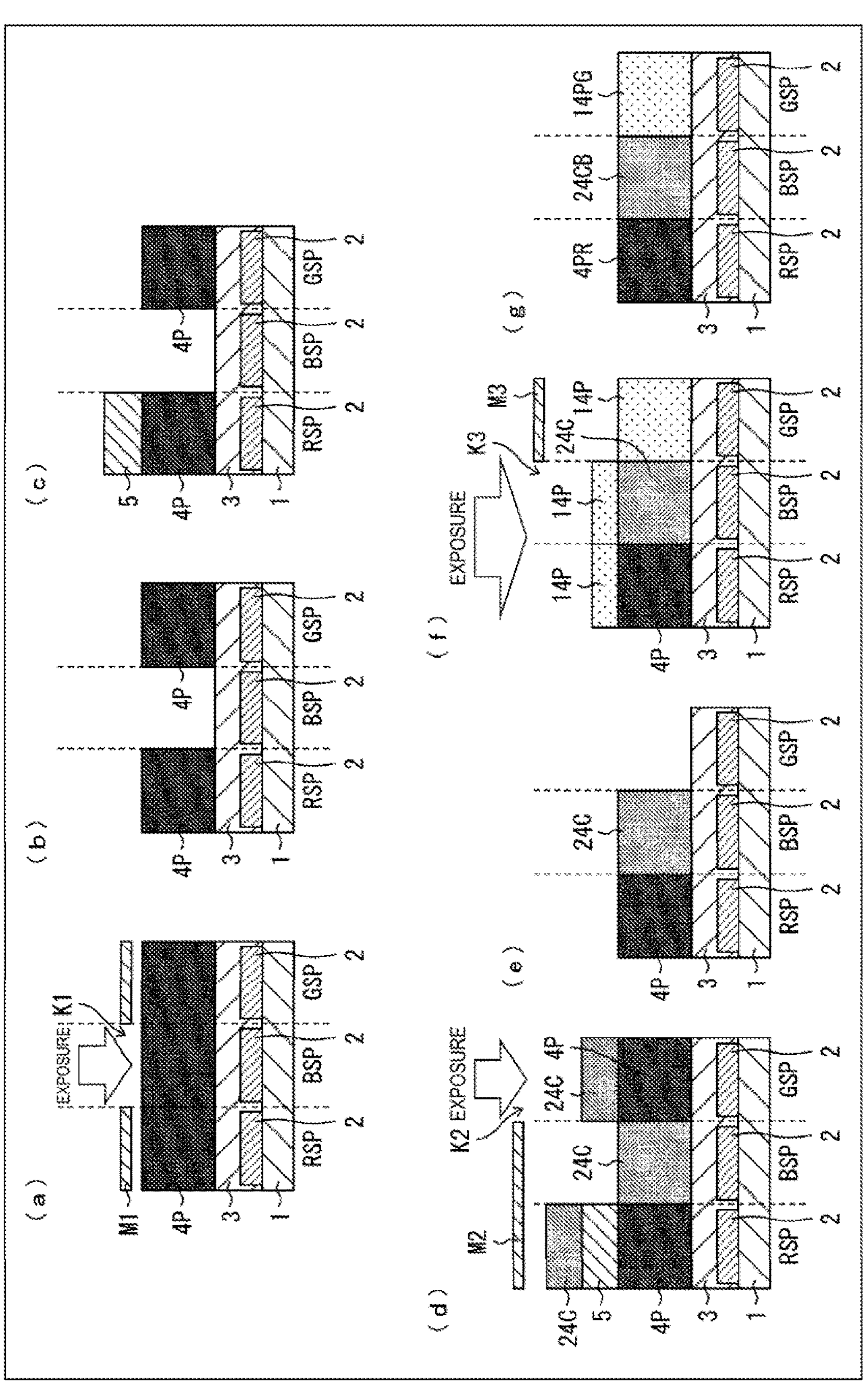
In FIG. 7, (a), (b), (c), (d), (e), (f), and (g) are diagrams each of which illustrates a part of a manufacturing process of a display device according to a third embodiment.

Each of (a) of FIG. 7, (b) of FIG. 7, (c) of FIG. 7, (d) of FIG. 7, (e) of FIG. 7, (f) of FIG. 7, and (g) of FIG. 7 is a diagram illustrating a part of a manufacturing process of the display device according to the third embodiment.

In the present embodiment, a case where the red light-emitting layer 4PR is formed by using the quantum dot resist 4P (a first solution) that is a solution obtained by dispersing a positive-working photosensitive resin, a quantum dot (QD) that emits red light and that serves as a first light-emitting material, and a polar ligand around the quantum dot (QD) in propylene glycol monomethyl ether acetate (PGMEA) that is a polar solvent serving as a first solvent, the blue light-emitting layer 24CB is formed by using the quantum dot colloid 24C (a second solution) that is a solution not including a photosensitive resin, the solution being obtained by dispersing a quantum dot (QD) that emits blue light and that serves as a second light-emitting material, and a non-polar ligand around the quantum dot (QD) in octane that is a non-polar solvent serving as a second solvent, and the green light-emitting layer 14PG is formed by using the quantum dot resist 14P (a third solution) that is a solution obtained by dispersing a positive-working photosensitive resin, a quantum dot (QD) that emits green light and that serves as a third light-emitting material, and a polar ligand around the quantum dot (QD) in a polar solvent serving as a third solvent, for example, water (the SP value=23.4), ethanol (the SP value=12.7), isopropanol (the SP value=11.5), methanol (the SP value=14.5 to 14.8), or n-butanol (the SP value=11.3), will be described as an example, but no such limitation is intended. Note that since an SP value of the first light-emitting material is closer to the SP value of PGMEA (the SP value=8.7) that is the first solvent than to the SP value of the third solvent, and an SP value of the third light-emitting material is closer to the SP value of the third solvent than to the SP value of PGMEA (the SP value=8.7) that is the first solvent, a solubility of the first light-emitting material in the third solvent included in the quantum dot resist 14P that is the third solution is less than a solubility of the first light-emitting material in the first solvent included in the quantum dot resist 4P that is the first solution.

As illustrated in (a) of FIG. 7, the quantum dot resist 4P (the first solution) is applied onto the entire surface of the hole transport layer 3 provided so as to cover the anode 2 provided in each of the red subpixel RSP, the blue subpixel BSP, and the green subpixel GSP on the substrate 1, that is, to the portion corresponding to the red subpixel RSP, the portion corresponding to the blue subpixel BSP, and the portion corresponding to the green subpixel GSP. The quantum dot resist 4P can be applied by using, for example, a spin coating method or a bar coating method. Then, by using the mask M1 including the opening K1 at the portion corresponding to the blue subpixel BSP, the portion of the applied quantum dot resist 4P corresponding to the blue subpixel BSP is exposed. Then, as illustrated in (b) of FIG. 7, the portion that corresponds to the blue subpixel BSP and that is the exposed portion of a film formed by applying the quantum dot resist 4P is developed, so that the portion corresponding to the blue subpixel BSP can be removed. Note that although omitted in the present embodiment, after the development, a step of soft baking (a step of temporarily baking) that is a step of heat treatment at a relatively low temperature and that is to be performed for a relatively short time may be performed as necessary.

Thereafter, as illustrated in (c) of FIG. 7, the peeling layer 5 made of a water soluble resin to be peeled off by aqueous development is formed on the quantum dot resist 4P at the portion corresponding to the red subpixel RSP (a step of forming a peeling layer). Note that as the water soluble resin, for example, polyvinyl alcohol (PVA) or the like can be used, but the water soluble resin is not limited thereto. In addition, patterning of the peeling layer 5 can be performed by mist vapor deposition using a mask, a spray method using a mask, or the like, but is not limited thereto.

Thereafter, as illustrated in (d) of FIG. 7, the quantum dot colloid 24C (the second solution) is applied onto the entire surface, that is, the portion corresponding to the red subpixel RSP, the portion corresponding to the blue subpixel BSP, and the portion corresponding to the green subpixel GSP.

Thus, octane that is the non-polar solvent included in the quantum dot colloid 24C comes into contact with the applied quantum dot resist 4P. Additionally, a position where octane that is the non-polar solvent comes into contact with the applied quantum dot resist 4P includes a light-emitting region in the display region DA. The quantum dot colloid 24C can be applied by using, for example, a spin coating method or a bar coating method. Note that in this step, the applied quantum dot resist 4P comes into contact with octane that is the non-polar solvent included in the quantum dot colloid 24C, but the first light-emitting material included in the quantum dot resist 4P is unlikely to be dissolved by octane that is the non-polar solvent included in the quantum dot colloid 24C. That is, color mixing is unlikely to occur. Then, a portion of the applied quantum dot resist 4P corresponding to the green subpixel GSP is exposed by using the mask M2 including the opening K2 at the portion corresponding to the green subpixel GSP. That is, a portion corresponding to the green subpixel GSP of a first layered film obtained by layering the film formed by applying the quantum dot resist 4P and a film formed by applying the quantum dot colloid 24C is exposed. Then, as illustrated in (e) of FIG. 7, the portion of the first layered film corresponding to the green subpixel GSP, the peeling layer 5, and the quantum dot colloid 24C applied on the peeling layer 5 are removed by performing development including aqueous development. Note that although omitted in the present embodiment, after the development, a step of soft baking that is a step of heat treatment at a relatively low temperature and that is to be performed for a relatively short time may be performed as necessary. Note that in the aqueous development, development is carried out by using an aqueous developer. As the aqueous developer, an alkaline aqueous solution can be used, and examples of the alkaline aqueous solution include tetramethylammonium hydroxide (TMAH), sodium hydroxide, potassium hydroxide, calcium hydroxide, and sodium carbonate.

Thereafter, as illustrated in (f) of FIG. 7, the quantum dot resist 14P (the third solution) is applied onto the entire surface, that is, the portion corresponding to the red subpixel RSP, the portion corresponding to the blue subpixel BSP, and the portion corresponding to the green subpixel GSP. Thus, the polar solvent included in the quantum dot resist 14P, for example, water (the SP value=23.4), ethanol (the SP value=12.7), isopropanol (the SP value=11.5), and methanol (the SP value=14.5 to 14.8), or n-butanol (the SP value=11.3), comes into contact with the quantum dot colloid 24C and the quantum dot resist 4P that have been applied. In addition, a position where the quantum dot colloid 24C and the quantum dot resist 4P that have been applied come into contact with a polar solvent such as water, ethanol, isopropanol, methanol, or n-butanol includes a light-emitting region in the display region DA. The quantum dot resist 14P can be applied by using, for example, a spin coating method or a bar coating method. Note that in this step, the applied quantum dot resist 14P comes into contact with the applied quantum dot colloid 24C, but the second light-emitting material included in the quantum dot colloid 24C is hardly dissolved by the polar solvent included in the quantum dot resist 14P, such as water, ethanol, isopropanol, methanol, or n-butanol. That is, color mixing is unlikely to occur. Additionally, in this step, the applied quantum dot resist 14P comes into contact with the applied quantum dot resist 4P, but the first light-emitting material included in the quantum dot resist 4P is less likely to be dissolved by the polar solvent included in the quantum dot resist 14P, such as water, ethanol, isopropanol, methanol, or n-butanol. That is, color mixing is unlikely to occur. Thereafter, the portion corresponding to the red subpixel RSP and the portion corresponding to the blue subpixel BSP of the applied quantum dot resist 14P are exposed by using the mask M3 including the opening K3 at the portion corresponding to the red subpixel RSP and the portion corresponding to the blue subpixel BSP.

Thereafter, by development, as illustrated in (g) of FIG. 7, the red light-emitting layer 4PR can be formed in the red subpixel RSP, the blue light-emitting layer 24CB can be formed in the blue subpixel BSP, and the green light-emitting layer 14PG can be formed in the green subpixel GSP. That is, each of the red light-emitting layer 4PR, the blue light-emitting layer 24CB, and the green light-emitting layer 14PG emits light in a different region. Note that although omitted in the present embodiment, after the development, a step of soft baking that is a step of heat treatment at a relatively low temperature and that is to be performed for a relatively short time may be performed as necessary.

After that, in the present embodiment, hard baking (firing) is separately performed, but no such limitation is intended. For example, hard baking of the red light-emitting layer 4PR, the blue light-emitting layer 24CB, and the green light-emitting layer 14PG may be performed together with hard baking of a film formed in a subsequent step. Note that although (g) of FIG. 7 illustrates a case where a film thickness of the red light-emitting layer 4PR, a film thickness of the blue light-emitting layer 24CB, and a film thickness of the green light-emitting layer 14PG are the same, no such limitation is intended, and the film thickness of the red light-emitting layer 4PR, the film thickness of the blue light-emitting layer 24CB, and the film thickness of the green light-emitting layer 14PG may be different from each other. For example, the light-emitting layers of three colors may have different film thicknesses, or the light-emitting layers of two colors may have the same film thickness and the light-emitting layer of the remaining one color may have a film thickness different from the film thickness of the light-emitting layers of the two colors.

As described above, in the manufacturing process of the display device of the present embodiment, it is not necessary to perform hard baking (firing) for each process of forming each light-emitting layer, and the method for manufacturing the display device with high productivity and the display device can be achieved. Furthermore, since it is not necessary to perform hard baking for each process of forming each light-emitting layer, thermal degradation of the light-emitting layer can also be suppressed.

Fourth Embodiment

Next, with reference to FIG. 8 and FIG. 9, a fourth embodiment of the disclosure will be described. A method for manufacturing a display device according to the present embodiment is different from the method for manufacturing the display device described in each of the first to third embodiments in that dissolution preventing layers 3*a*, 16, 7 are used. The others are as described in the first to third embodiments. For convenience of description, members having the same functions as those of the members described in drawings of the first to third embodiments are denoted by the same reference signs, and descriptions thereof are omitted.

Figure 8:
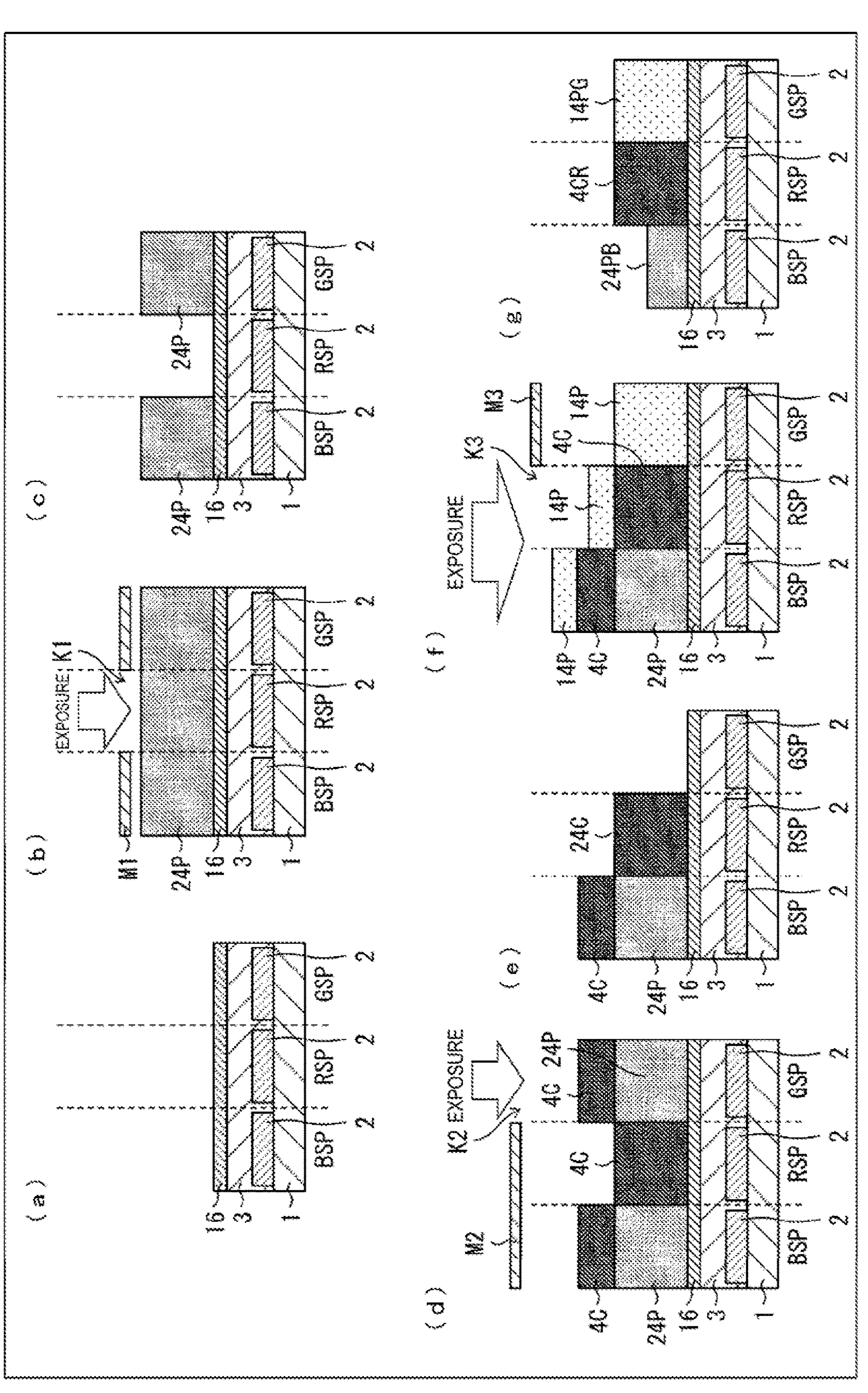
In FIG. 8, (a), (b), (c), (d), (e), (f), and (g) are diagrams each of which illustrates a part of a manufacturing process of a display device according to a fourth embodiment.

Each of (a) of FIG. 8, (b) of FIG. 8, (c) of FIG. 8, (d) of FIG. 8, (e) of FIG. 8, (f) of FIG. 8. and (g) of FIG. 8 is a diagram illustrating a part of a manufacturing process of the display device according to the fourth embodiment.

In the present embodiment, a case where the blue light-emitting layer 24PB is formed by using the quantum dot resist 24P (a first solution) that is a solution obtained by dispersing a positive-working photosensitive resin, a quantum dot (QD) that emits blue light and that serves as a first light-emitting material, and a polar ligand around the quantum dot (QD) in propylene glycol monomethyl ether acetate (PGMEA) that is a polar solvent serving as a first solvent, the red light-emitting layer 4CR is formed by using the quantum dot colloid 4C (a second solution) that is a solution not including a photosensitive resin, the solution being obtained by dispersing a quantum dot (QD) that emits red light and that serves as a second light-emitting material, and a non-polar ligand around the quantum dot (QD) in octane that is a non-polar solvent serving as a second solvent, and the green light-emitting layer 14PG is formed by using the quantum dot resist 14P (a third solution) that is a solution obtained by dispersing a positive-working photosensitive resin, a quantum dot (QD) that emits green light and that serves as a third light-emitting material, and a polar ligand around the quantum dot (QD) in PGMEA that is a polar solvent serving as a third solvent will be described as an example, but no such limitation is intended.

As illustrated in (a) of FIG. 8, the dissolution preventing layer 16 is applied onto the entire surface of the hole transport layer 3 provided so as to cover the anode 2 provided in each of the red subpixel RSP, the blue subpixel BSP, and the green subpixel GSP on the substrate 1. Thereafter, as illustrated in (b) of FIG. 8, the quantum dot resist 24P is applied onto the entire surface of the dissolution preventing layer 16. Note that each of the subsequent step illustrated in (b) of FIG. 8, and steps illustrated in (c) of FIG. 8, (d) of FIG. 8, (e) of FIG. 8, (f) of FIG. 8, and (g) of FIG. 8 has already been described with reference to (a) of FIG. 3 to (f) of FIG. 3 in the first embodiment, and thus, description thereof is omitted.

In the present embodiment, since a light-emitting element having a regular layered structure in which the anode 2, the hole transport layer 3, any one layer of the red light-emitting layer 4CR, the green light-emitting layer 14PG, and the blue light-emitting layer 24PB, the electron transport layer 5, and the cathode 6 are formed in this order from the substrate 1 side is provided, a case where the dissolution preventing layer 16 is formed on the hole transport layer 3 will be described as an example, but no such limitation is intended. For example, when a light-emitting element has an inverted layered structure in which the cathode 6, the electron transport layer 5, any one layer of the red light-emitting layer 4CR, the green light-emitting layer 14PG, and the blue light-emitting layer 24PB, the hole transport layer 3, and the anode 2 are formed in this order from the substrate 1 side is provided, the dissolution preventing layer 16 is formed on the electron transport layer 5. Further, when a hole injection layer is provided instead of the hole transport layer 3, the dissolution preventing layer 16 may be formed on the hole injection layer, and when an electron injection layer is provided instead of the electron transport layer 5, the dissolution preventing layer 16 may be formed on the electron injection layer.

A material of the dissolution preventing layer 16 is not particularly limited as long as the material is insoluble in the first solvent included in the quantum dot resist 24P, the second solvent included in the quantum dot colloid 4C, and the third solvent included in the quantum dot resist 14P. For example, the dissolution preventing layer 16 may be formed of a thiophene-based compound (such as polythiophene (PEDOT)), a pyrrole-based compound (such as polypyrrole), an aniline-based compound (such as polyaniline), copper phthalocyanine (CuPc), polyphenylene vinylene (PPV), or the like.

When the dissolution preventing layer 16 is formed of an insulating material, a film thickness thereof is preferably equal to or less than 10 nm, and more preferably equal to or less than 5 nm, and preferably equal to or greater than 10 pm.

In particular, as illustrated in (b) of FIG. 8, since the quantum dot resist 24P is in contact with the entire surface of the dissolution preventing layer 16, it is preferable that a solubility of the dissolution preventing layer 16 in the first solvent included in the quantum dot resist 24P be made less than a solubility of the hole transport layer 3 or the electron transport layer 5 in the first solvent included in the quantum dot resist 24P.

In addition, by providing the dissolution preventing layer 16 between each light-emitting layer and the hole transport layer 3 or the electron transport layer 5, an effect of improving carrier balancing can also be obtained.

Figure 9:
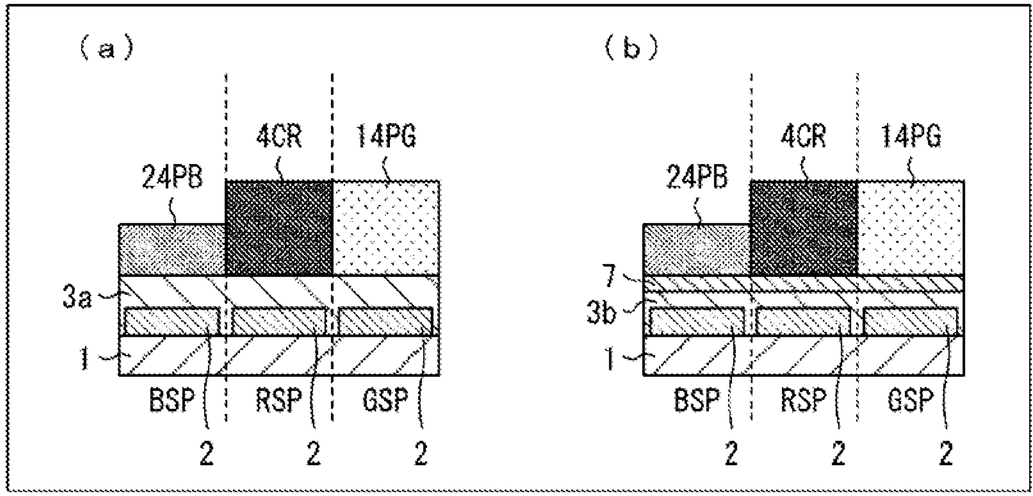
In FIG. 9, (a) and (b) are cross-sectional views each of which illustrates a schematic configuration of a part of another display device according to the fourth embodiment.

Each of (a) of FIG. 9 and (b) of FIG. 9 is a cross-sectional view illustrating a schematic configuration of a part of another display device according to the fourth embodiment.

(a) of FIG. 9 is a cross-sectional view illustrating a schematic configuration of a part of a display device including a dissolution preventing layer 3*a* instead of the dissolution preventing layer 16 illustrated in FIG. 8.

The dissolution preventing layer 3*a* illustrated in (a) of FIG. 9 is a dissolution preventing layer that also functions as a hole transport layer or an electron transport layer. The dissolution preventing layer 3*a* can be formed of, for example, a hole transport material or an electron transport material that is a type to be cured by at least one of light and heat. Solvents are less likely to permeate such a type to be cured of the hole transport material or the electron transport material, so that dissolution by using a solvent is less likely to occur. Note that as the type to be cured of the hole transport material or the electron transport material, for example, materials described in JP 2009-176964 A and JP 2006-245178 A, or the like may be used.

(b) of FIG. 9 is a cross-sectional view illustrating a schematic configuration of a part of a display device including a dissolution preventing layer 7 instead of the dissolution preventing layer 16 illustrated in FIG. 8.

A hole transport layer 3*b* illustrated in (b) of FIG. 9 is a non-curable type of a hole transport layer. As illustrated in (b) of FIG. 9, by providing the dissolution preventing layer 7 on the hole transport layer 3*b*, the dissolution of the hole transport layer 3*b* by a solvent can be prevented. The dissolution preventing layer 7 is a layer in which a part of the hole transport layer 3*b* farther from the substrate 1 is made insoluble by chemical treatment. That is, the dissolution preventing layer 7 is a layer obtained by making a part of the hole transport layer 3*b* insoluble. Examples of the chemical treatment for the insolubilization include silylation, fluorination, and aceneization, but the chemical treatment is not limited thereto. In addition, for example, silylation described in JP 2000-208254 A may be performed as the chemical treatment for the insolubilization.

According to the manufacturing process of the display device of the present embodiment, since the dissolution preventing layers 3*a*, 16, and 7 are provided, damage to the hole transport layers 3 and 3*b* or the electron transport layer 5 due to a solvent can be suppressed, and carrier balancing can also be improved.

Fifth Embodiment

Next, a fifth embodiment according to the disclosure will be described with reference to FIG. 10, FIG. 11, and FIG. 12.

A method for manufacturing a display device according to the present embodiment is different from the method for manufacturing the display device described in each of the first to fourth embodiments in that two types of light-emitting layers having different luminescent colors are layered in some of the subpixels. The others are as described in the first to fourth embodiments. For convenience of description, members having the same functions as those of the members illustrated in drawings of the first to fourth embodiments are denoted with the same reference signs, and descriptions thereof may be omitted.

Figure 10:
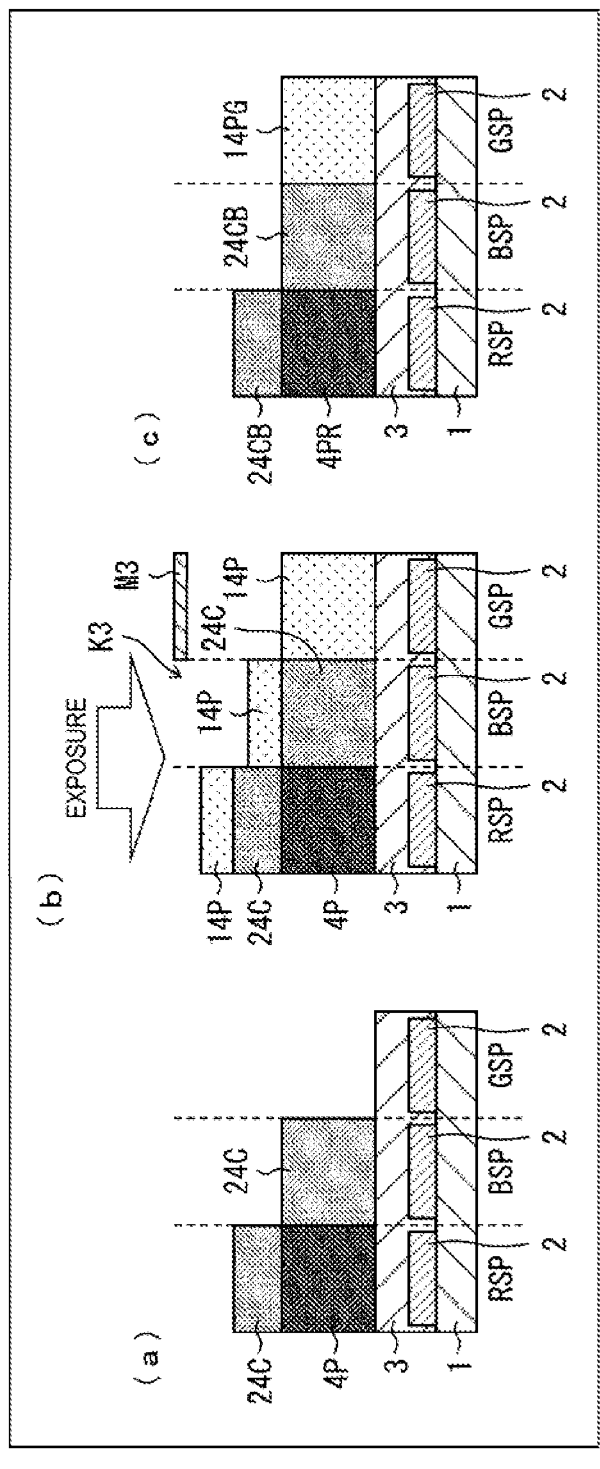
In FIG. 10, (a), (b), and (c) are diagrams each of which illustrates a part of a manufacturing process of a display device according to a fifth embodiment.

Each of (a) of FIG. 10, (b) of FIG. 10, and (c) of FIG. 10 is a diagram illustrating a part of a manufacturing process of the display device according to the fifth embodiment.

Since steps up to (a) of FIG. 10 are the same as the steps up to (d) of FIG. 3 described in the first embodiment, description thereof is omitted here.

As illustrated in (b) of FIG. 10, the quantum dot resist 14P (a third solution) that is a solution obtained by dispersing a positive-working photosensitive resin, a quantum dot (QD) that emits green light, and a polar ligand around the quantum dot (QD) in PGMEA that is a polar solvent is applied onto the entire surface, that is, a portion corresponding to the red subpixel RSP, a portion corresponding to the blue subpixel BSP, and a portion corresponding to the green subpixel GSP. Thus, PGMEA, which is the polar solvent, comes into contact with the applied quantum dot colloid 24C. Moreover, a position where PGMEA, which is the polar solvent, comes into contact with the applied quantum dot colloid 24C includes a light-emitting region in the display region DA.

Note that in this step, the applied quantum dot resist 14P comes into contact with the applied quantum dot colloid 24C, but the second light-emitting material included in the quantum dot colloid 24C is hardly dissolved by PGMEA serving as the polar solvent included in the quantum dot resist 14P. That is, color mixing is unlikely to occur. On the other hand, in this step, since the applied quantum dot colloid 24C is provided between the applied quantum dot resist 14P and the applied quantum dot resist 4P, the applied quantum dot resist 14P can be minimized to be in contact with the applied quantum dot resist 4P.

Thereafter, as illustrated in (b) of FIG. 10, the portions of the applied quantum dot resist 14P individually corresponding to the red subpixel RSP and the blue subpixel BSP are exposed by using the mask M3 including the opening K3 at each of the portions corresponding to the red subpixel RSP and the blue subpixel BSP.

Then, as illustrated in (c) of FIG. 10, the portions of the applied quantum dot resist 14P individually corresponding to the red subpixel RSP and the blue subpixel BSP are removed by development to form a first layered film including the red light-emitting layer 4PR and the blue light-emitting layer 24CB in the red subpixel RSP, the blue light-emitting layer 24CB in the blue subpixel BSP, and the green light-emitting layer 14PG in the green subpixel GSP. The red light-emitting layer 4PR of the red subpixel RSP, the blue light-emitting layer 24CB of the blue subpixel BSP, and the green light-emitting layer 14PG of the green subpixel GSP emit light in different regions. Note that although omitted in the present embodiment, after the development, a step of soft baking that is a step of heat treatment at a relatively low temperature and that is to be performed for a relatively short time may be performed as necessary.

After that, in the present embodiment, hard baking (firing) is separately performed, but no such limitation is intended. For example, hard baking of the red light-emitting layer 4PR, the blue light-emitting layer 24CB, and the green light-emitting layer 14PG may be performed together with hard baking of a film formed in a subsequent step.

By leaving the blue light-emitting layer 24CB on the red light-emitting layer 4PR of the red subpixel RSP as it is without removing the blue light-emitting layer 24CB as in the present embodiment, the control of the manufacturing process can be achieved and improvement of element characteristics due to improvement of carrier balancing of the red light-emitting element can be expected.

Figure 11:
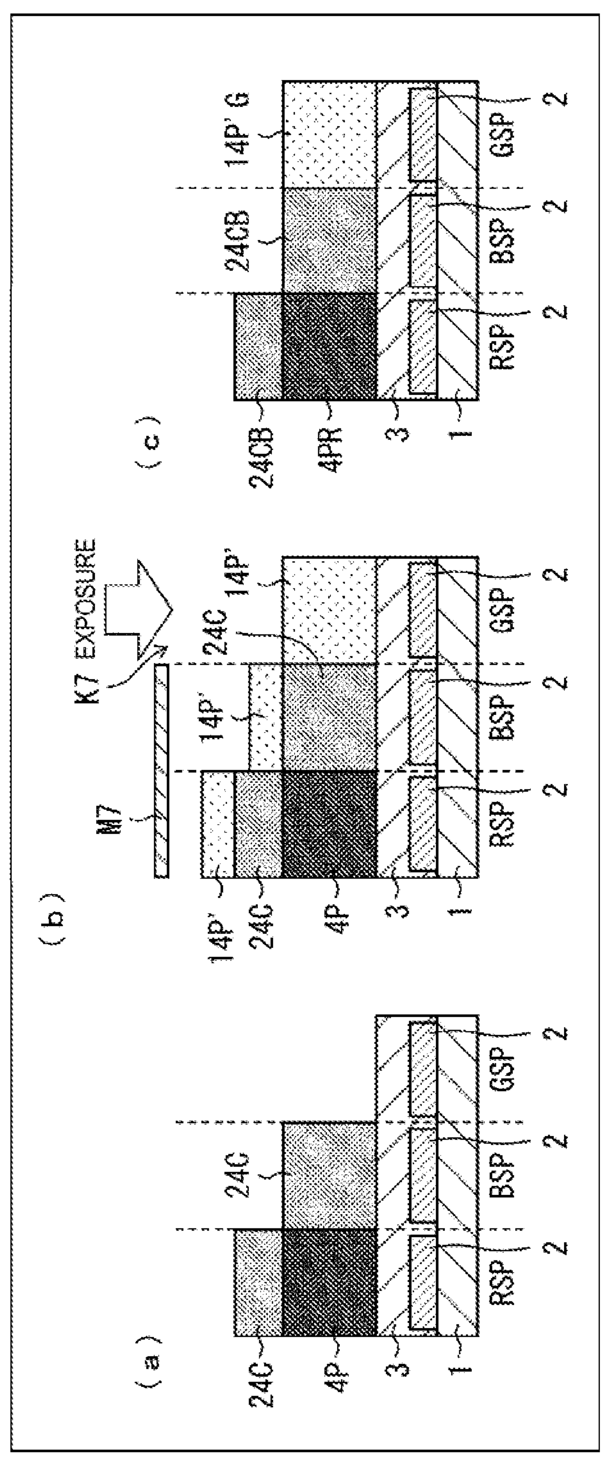
In FIG. 11, (a), (b), and (c) are diagrams each of which illustrates a part of a manufacturing process of another display device according to the fifth embodiment.

Each of (a) of FIG. 11, (b) of FIG. 11, and (c) of FIG. 11 is a diagram illustrating a part of the manufacturing process of another display device according to the fifth embodiment.

Since steps up to (a) of FIG. 11 are the same as the steps up to (d) of FIG. 3 described in the first embodiment, description thereof is omitted here.

Here, as illustrated in (b) of FIG. 11 and (c) of FIG. 11, (b) of FIG. 11 and (c) of FIG. 11 are different from (b) of FIG. 10 and (c) of FIG. 10 in that a green light-emitting layer 14P'G is formed by using a quantum dot resist 14P' (a third solution) that is a solution obtained by dispersing a negative-working photosensitive resin, a quantum dot (QD) that emits green light and that serves as a third light-emitting material, and a polar ligand around the quantum dot (QD), in PGMEA that is a polar solvent serving as a third solvent. Thus, as illustrated in (b) of FIG. 11, a portion of the applied quantum dot resist 14P' corresponding to the green subpixel GSP is exposed by using a mask M7 including an opening K7 at the portion corresponding to the green subpixel GSP.

As described above, by using the quantum dot resist 14P' including a negative-working photosensitive resin, as illustrated in (b) of FIG. 11, only the portion corresponding to the green subpixel GSP needs to be exposed, so that deterioration due to exposure of the red light-emitting layer 4PR and the blue light-emitting layer 24CB other than the green light-emitting layer 14P'G can be suppressed.

Figure 12:
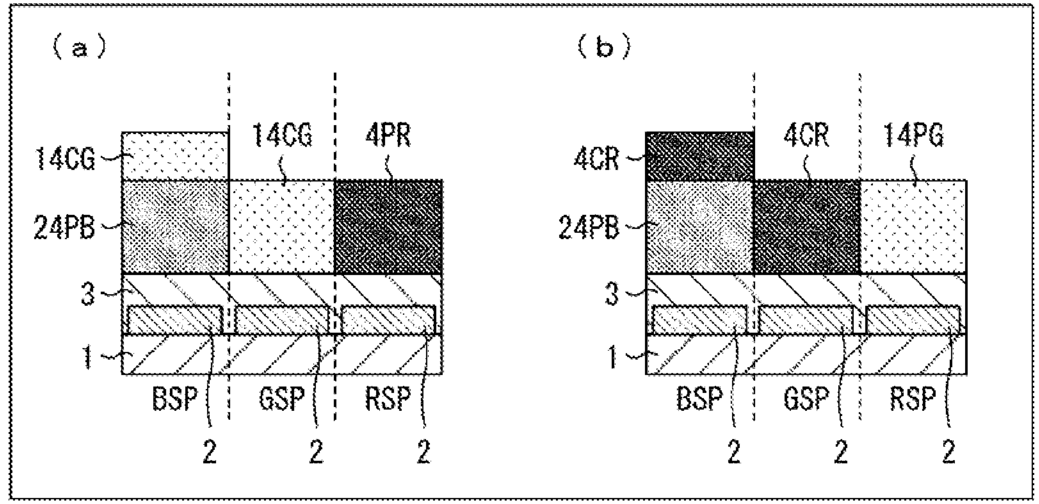
In FIG. 12, (a) and (b) are cross-sectional views each of which illustrates a schematic configuration of a part of further different display device according to the fifth embodiment.

Each of (a) of FIG. 12 and (b) of FIG. 12 is a cross-sectional view illustrating a schematic configuration of a part of further different display device according to the fifth embodiment.

As illustrated in (a) of FIG. 12, when the blue subpixel BSP includes a first layered film in which the blue light-emitting layer 24PB and the green light-emitting layer 14CG are layered in this order from the substrate 1 side, that is, when the light-emitting layers are provided in the order in which electrons are easily injected from the electron transport layer 5 side, a band structure of the first layered film can be stepped, which can improve an electron injection efficiency in the blue light-emitting element having a regular layered structure.

As illustrated in (b) of FIG. 12, when the blue subpixel BSP includes the first layered film in which the blue light-emitting layer 24PB and the red light-emitting layer 4CR are layered in this order from the substrate 1 side, that is, when the light-emitting layers are provided in the order in which electrons are easily injected from the electron transport layer 5 side, the band structure of the first layered film can be stepped, which can improve an electron injection efficiency in the blue light-emitting element having the regular layered structure.

Note that as illustrated in (c) of FIG. 10 and (c) of FIG. 11, for example, when the light-emitting element has an inverted layered structure in which the red subpixel RSP includes the first layered film in which the red light-emitting layer 4PR and the blue light-emitting layer 24CB are layered in this order from the substrate 1 side and the electron transport layer 5 is provided instead of the hole transport layer 3, the light-emitting layers are provided in the order in which electrons are easily injected from the electron transport layer 5 side, which enables the band structure of the first layered film to be stepped. Thus, an electron injection efficiency can be improved in the red light-emitting element.

Note that although the electron injection efficiency can be improved in the red light-emitting element and the blue light-emitting element in the present embodiment, no such limitation is intended, and the electron injection efficiency can be improved also in the green light-emitting element.

Sixth Embodiment

Next, a sixth embodiment of the disclosure will be described with reference to FIG. 13. A method for manufacturing a display device according to the present embodiment is different from the method for manufacturing the display device described in the fifth embodiment in that three types of light-emitting layers having different luminescent colors are layered in some of the subpixels. The others are as described in the fifth embodiment. For convenience of description, members having the same functions as those of the members illustrated in the drawings in the fifth embodiment are denoted by the same reference signs, and description thereof is omitted.

Figure 13:
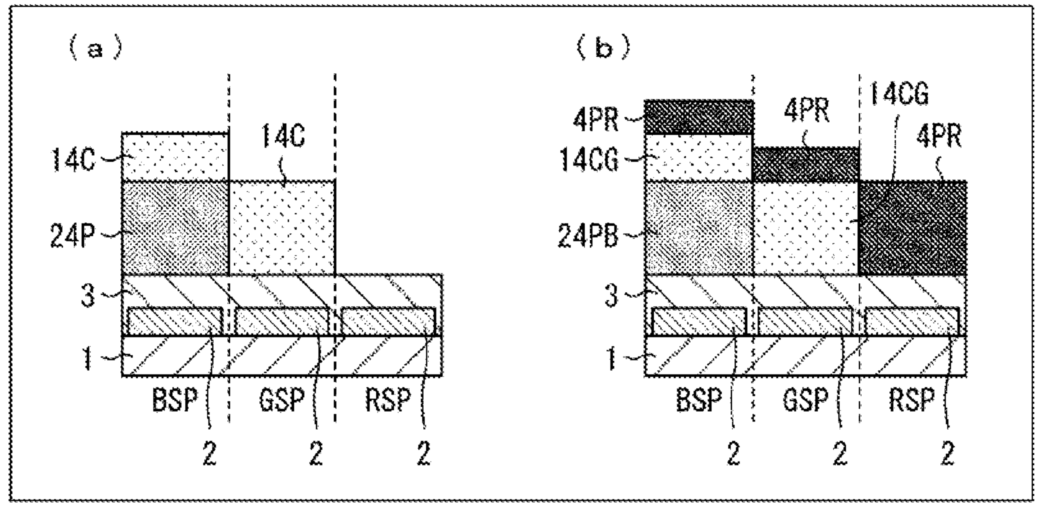
In FIG. 13, (a) and (b) are diagrams each of which illustrates a part of a manufacturing process of a display device according to a sixth embodiment.

Each of (a) of FIG. 13 and (b) of FIG. 13 is a diagram illustrating a part of a manufacturing process of the display device according to the sixth embodiment.

Since steps up to (a) of FIG. 13 are the same as the steps up to (d) of FIG. 3 described in the first embodiment, description thereof is omitted here.

As illustrated in (b) of FIG. 13, the quantum dot resist 4P (a third solution) that is a solution obtained by dispersing a positive-working photosensitive resin, a quantum dot (QD) that emits red light, and a polar ligand around the quantum dot (QD) in PGMEA that is a polar solvent is applied to the entire surface, that is, a portion corresponding to the red subpixel RSP, a portion corresponding to the blue subpixel BSP, and a portion corresponding to the green subpixel GSP. Thus, PGMEA that is the polar solvent comes into contact with the green light-emitting layer 14CG. Further, a position where PGMEA that is the polar solvent and the green light-emitting layer 14CG come into contact with each other includes the light-emitting region in the display region DA.

Note that in this step, the applied quantum dot resist 4P comes into contact with the green light-emitting layer 14CG, but the second light-emitting material included in the green light-emitting layer 14CG is less likely to be dissolved by PGMEA that is the polar solvent included in the quantum dot resist 4P. That is, color mixing is unlikely to occur. On the other hand, since the green light-emitting layer 14CG exists between the applied quantum dot resist 4P and the blue light-emitting layer 24PB, contact between the quantum dot resist 4P and the blue light-emitting layer 24PB can be minimized.

As illustrated in (b) of FIG. 13, when the blue subpixel BSP includes a second layered film in which the blue light-emitting layer 24PB, the green light-emitting layer 14CG, and the red light-emitting layer 4PR are layered in this order from the substrate 1 side, that is, when the light-emitting layers are provided in the order in which electrons are easily injected from the electron transport layer 5 side, a band structure of the second layered film can be stepped, which can improve an electron injection efficiency in the blue light-emitting element having a regular layered structure.

In addition, as illustrated in (b) of FIG. 13, when the green subpixel GSP includes a third layered film in which the green light-emitting layer 14CG and the red light-emitting layer 4PR are layered in this order from the substrate 1 side, that is, when the light-emitting layers are provided in the order in which electrons are easily injected from the electron transport layer 5 side, a band structure of the third layered film can be stepped, which can improve an electron injection efficiency in the green light-emitting element having a regular layered structure.

Note that in the present embodiment, the case of the light-emitting element having the regular layered structure has been described as an example, but no such limitation is intended, and a configuration in which three types of light-emitting layers having different luminescent colors are layered may be applied to a light-emitting element having an inverted layered structure. In this case, the red light-emitting layer 4PR, the green light-emitting layer 14CG, and the blue light-emitting layer 24PB may be layered in this order from the substrate 1 side.

Seventh Embodiment

Next, a seventh embodiment of the disclosure will be described with reference to FIG. 14. A method for manufacturing a display device according to the present embodiment is different from the method for manufacturing the display device described in each of the first to sixth embodiments in that the quantum dot colloid 24C is patterned by using a part of the applied quantum dot resist 14P (a third solution) as a mask. The others are as described in the first to sixth embodiments. For convenience of description, members having the same functions as those of the members described in drawings of the first to sixth embodiments are denoted by the same reference signs, and description thereof is omitted.

Figure 14:
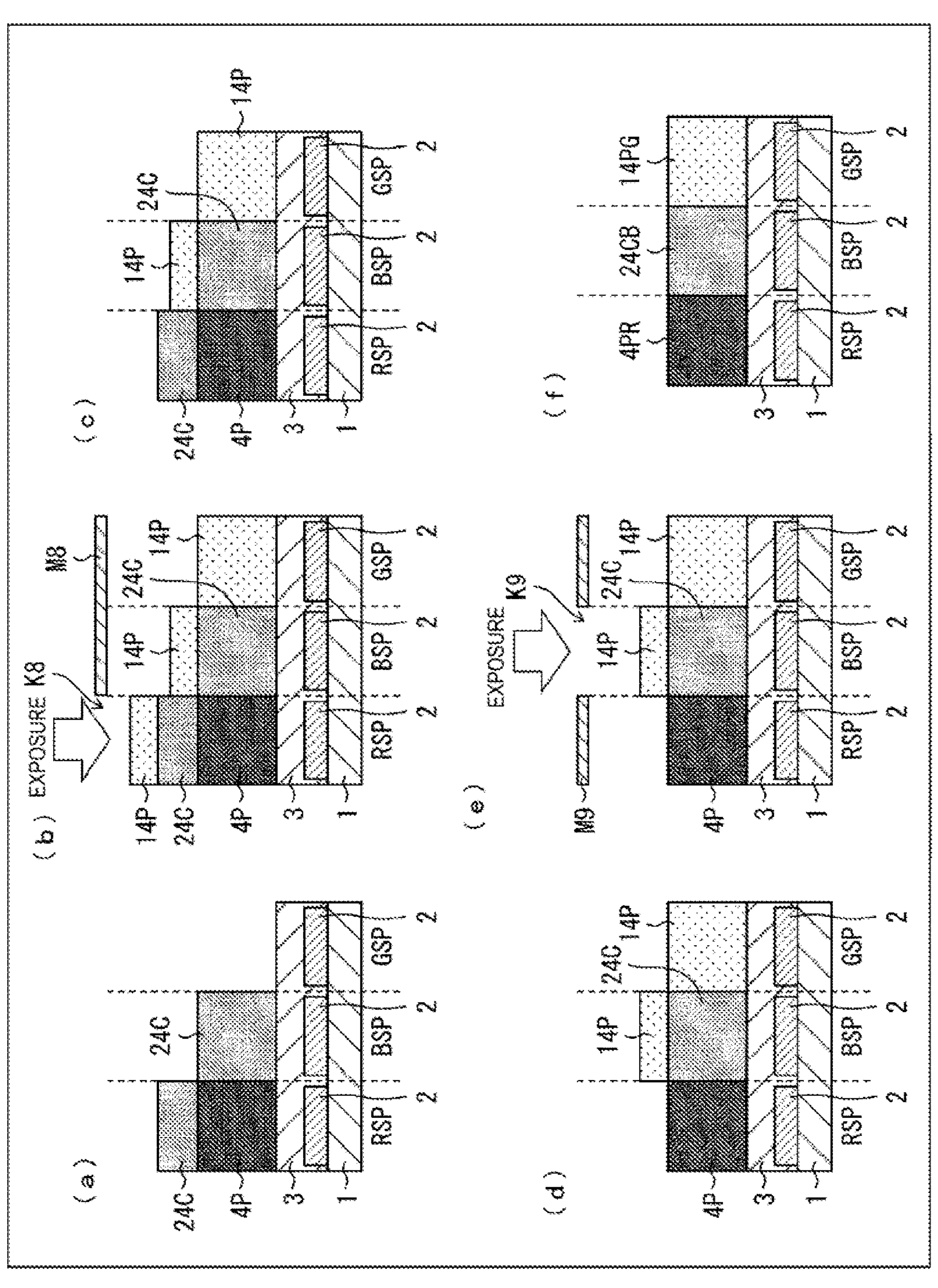
In FIG. 14, (a), (b), (c), (d), (e), and (f) are diagrams each of which illustrates a part of a manufacturing process of a display device according to a seventh embodiment.

Each of (a) of FIG. 14, (b) of FIG. 14, (c) of FIG. 14, (d) of FIG. 14, (e) of FIG. 14, and (f) of FIG. 14 is a diagram illustrating a part of a manufacturing process of the display device according to the seventh embodiment.

In the present embodiment, a case where the red light-emitting layer 4PR is formed by using the quantum dot resist 4P (a first solution) that is a solution obtained by dispersing a positive-working photosensitive resin, a quantum dot (QD) that emits red light and that serves as a first light-emitting material, and a polar ligand around the quantum dot (QD) in propylene glycol monomethyl ether acetate (PGMEA) that is a polar solvent serving as a first solvent, the blue light-emitting layer 24CB is formed by using the quantum dot colloid 24C (a second solution) that is a solution not including a photosensitive resin, the solution being obtained by dispersing a quantum dot (QD) that emits blue light and that serves as a second light-emitting material, and a non-polar ligand around the quantum dot (QD) in octane that is a non-polar solvent serving as a second solvent, and the green light-emitting layer 14PG is formed by using the quantum dot resist 14P (a third solution) that is a solution obtained by dispersing a positive-working photosensitive resin, a quantum dot (QD) that emits green light and that serves as a third light-emitting material, and a polar ligand around the quantum dot (QD) in PGMEA that is a polar solvent serving as a third solvent will be described as an example, but no such limitation is intended.

Since steps up to (a) of FIG. 14 are the same as the steps up to (d) of FIG. 3 described in the first embodiment, description thereof is omitted here.

Thereafter, as illustrated in (b) of FIG. 14, the quantum dot resist 14P is applied onto the entire surface, that is, a portion corresponding to the red subpixel RSP, a portion corresponding to the blue subpixel BSP, and a portion corresponding to the green subpixel GSP. Note that in this step, the applied quantum dot resist 14P comes into contact with the applied quantum dot colloid 24C, but the second light-emitting material included in the quantum dot colloid 24C is hardly dissolved by PGMEA serving as the polar solvent included in the quantum dot resist 14P. That is, color mixing is unlikely to occur. On the other hand, in this step, since the applied quantum dot colloid 24C is provided between the applied quantum dot resist 14P and the applied quantum dot resist 4P, the applied quantum dot resist 14P can be minimized to be in contact with the applied quantum dot resist 4P.

Thereafter, as illustrated in (b) of FIG. 14, the portion of the applied quantum dot resist 14P corresponding to the red subpixel RSP is exposed by using a mask M8 including an opening K8 at the portion corresponding to the red subpixel RSP.

Then, as illustrated in (c) of FIG. 14, a portion of the applied quantum dot resist 14P corresponding to the red subpixel RSP is removed by development. Thereafter, as illustrated in (d) of FIG. 14, a portion of the applied quantum dot colloid 24C corresponding to the red subpixel RSP is removed by washing with a solvent in which a solubility of the second light-emitting material is higher than solubilities of the first light-emitting material and the third light-emitting material, for example, octane that is the non-polar solvent in the present embodiment. Note that in this step, in the blue subpixel BSP, the applied quantum dot resist 14P formed on the applied quantum dot colloid 24C serves as a mask for protecting the applied quantum dot colloid 24C, which is a lower layer, in cleaning with octane.

Thereafter, as illustrated in (e) of FIG. 14, a portion of the applied quantum dot resist 14P corresponding to the blue subpixel BSP is exposed by using a mask M9 including an opening K9 at the portion corresponding to the blue subpixel BSP. Then, as illustrated in (f) of FIG. 14, by development, the red light-emitting layer 4PR can be formed in the red subpixel RSP, the blue light-emitting layer 24CB can be formed in the blue subpixel BSP, and the green light-emitting layer 14PG can be formed in the green subpixel GSP.

According to the above-described method for manufacturing the display device, film reduction of the red light-emitting layer 4PR can be suppressed.

Eighth Embodiment

Next, with reference to FIG. 15 and FIG. 16, an eighth embodiment of the disclosure will be described. A method for manufacturing a display device according to the present embodiment is different from the method for manufacturing the display device described in the first to seventh embodiments in that the method of the present embodiment further includes steps of forming first function layers 8 and 10 and a step of forming a second function layer 9. The others are as described in the first to seventh embodiments. For convenience of description, members having the same functions as those of the members described in drawings of the first to seventh embodiments are denoted by the same reference signs, and description thereof will be omitted.

Figure 15:
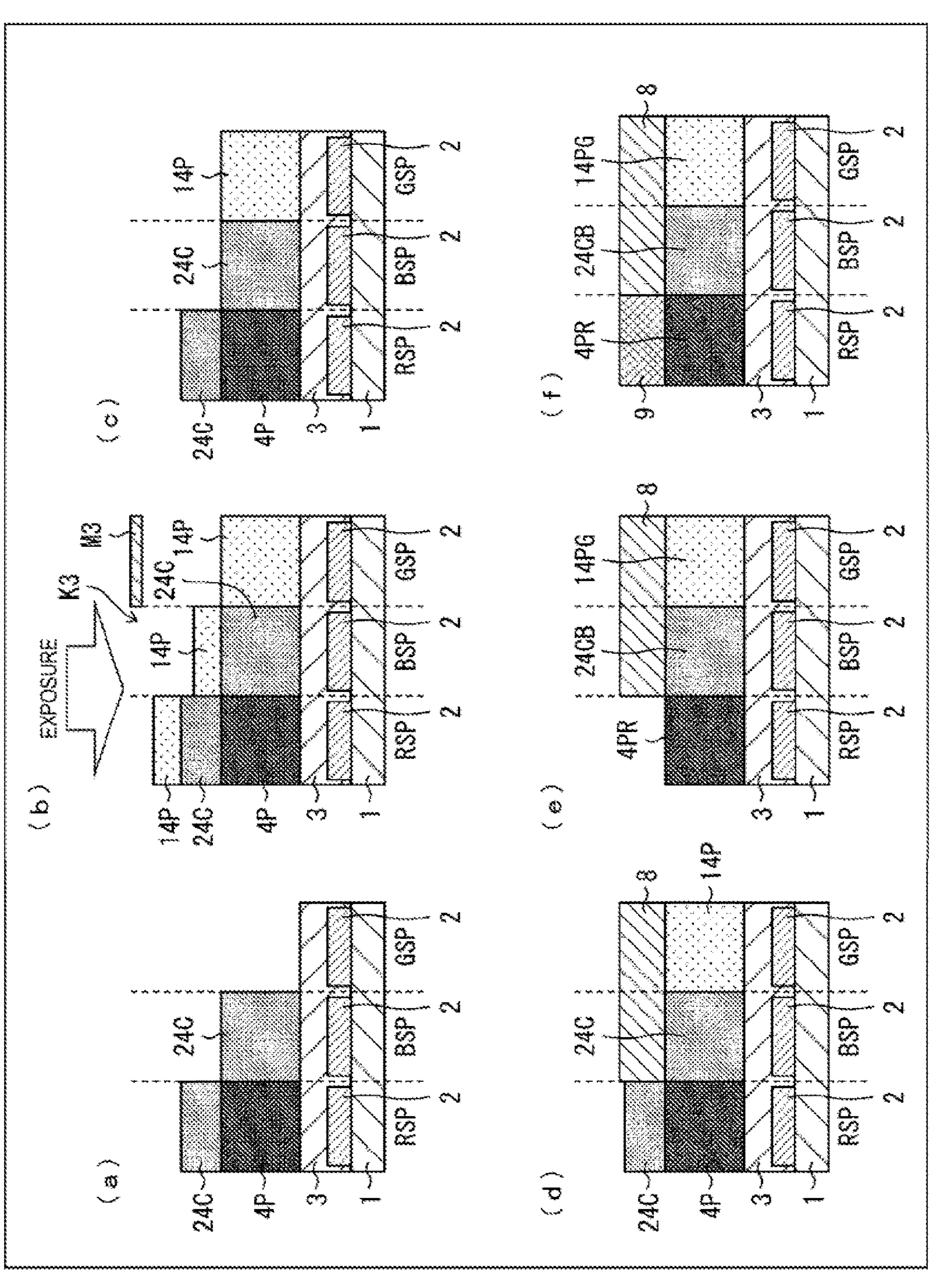
In FIG. 15, (a), (b), (c), (d), (e), and (f) are diagrams each of which illustrates a part of a manufacturing process of a display device according to an eighth embodiment.

Each of (a) of FIG. 15, (b) of FIG. 15, (c) of FIG. 15, (d) of FIG. 15, (e) of FIG. 15, and (f) of FIG. 15 is a diagram illustrating a part of a manufacturing process of the display device according to the eighth embodiment.

In the present embodiment, a case where the red light-emitting layer 4PR is formed by using the quantum dot resist 4P (a first solution) that is a solution obtained by dispersing a positive-working photosensitive resin, a quantum dot (QD) that emits red light and that serves as a first light-emitting material, and a polar ligand around the quantum dot (QD) in propylene glycol monomethyl ether acetate (PGMEA) that is a polar solvent serving as a first solvent, the blue light-emitting layer 24CB is formed by using the quantum dot colloid 24C (a second solution) that is a solution not including a photosensitive resin, the solution being obtained by dispersing a quantum dot (QD) that emits blue light and that serves as a second light-emitting material, and a non-polar ligand around the quantum dot (QD) in octane that is a non-polar solvent serving as a second solvent, and the green light-emitting layer 14PG is formed by using the quantum dot resist 14P (a third solution) that is a solution obtained by dispersing a positive-working photosensitive resin, a quantum dot (QD) that emits green light and that serves as a third light-emitting material, and a polar ligand around the quantum dot (QD) in PGMEA that is a polar solvent serving as a third solvent will be described as an example, but no such limitation is intended.

Since steps up to (a) of FIG. 15 are the same as the steps up to (d) of FIG. 3 described in the first embodiment, description thereof is omitted here.

Thereafter, as illustrated in (b) of FIG. 15, the quantum dot resist 14P is applied to the entire surface, that is, a portion corresponding to the red subpixel RSP, a portion corresponding to the blue subpixel BSP, and a portion corresponding to the green subpixel GSP. Note that in this step, the applied quantum dot resist 14P comes into contact with the applied quantum dot colloid 24C, but the second light-emitting material included in the quantum dot colloid 24C is hardly dissolved by PGMEA serving as the polar solvent included in the quantum dot resist 14P. That is, color mixing is unlikely to occur. On the other hand, in this step, since the applied quantum dot colloid 24C is provided between the applied quantum dot resist 14P and the applied quantum dot resist 4P, the applied quantum dot resist 14P can be minimized to be in contact with the applied quantum dot resist 4P.

Thereafter, as illustrated in (b) of FIG. 15, a portion corresponding to the red subpixel RSP and a portion corresponding to the blue subpixel BSP of the applied quantum dot resist 14P are exposed by using the mask M3 including the opening K3 at the portion corresponding to the red subpixel RSP and the portion corresponding to the blue subpixel BSP.

Then, as illustrated in (c) of FIG. 15, the portion corresponding to the red subpixel RSP and the portion corresponding to the blue subpixel BSP of the applied quantum dot resist 14P are removed by the development. Thereafter, as illustrated in (d) of FIG. 15, the first function layer 8 is patterned at the portion corresponding to the blue subpixel BSP and the portion corresponding to the green subpixel GSP. In the present embodiment, a case where the first function layer 8 is a photo-curable type of an electron transport layer will be described as an example, but the first function layer 8 is not particularly limited as long as the first function layer 8 can be patterned.

Note that since the first function layer 8 does not include a light-emitting material, color mixing does not occur between the first function layer 8 and the light-emitting layer that is a lower layer, and thus, a type of the solvent is not particularly limited.

Thereafter, as illustrated in (e) of FIG. 15, by washing with a solvent that dissolves the applied quantum dot colloid 24C but does not dissolve the photo-cured first function layer 8, for example, octane, which is a non-polar solvent, in the present embodiment, a portion of the applied quantum dot colloid 24C corresponding to the red subpixel RSP is removed. Since the solvent is less likely to penetrate into the first function layer 8 after photo-curing, the first function layer 8 after photo-curing is less likely to be dissolved by the solvent.

Thereafter, as illustrated in (f) of FIG. 15, the second function layer 9 is patterned at the portion corresponding to the red subpixel BSP. In the present embodiment, a case where the second function layer 9 is an electron transport layer of a photo-curable type will be described as an example, but the second function layer 9 is not limited thereto.

According to the above-described method for manufacturing the display device, film reduction of the red light-emitting layer 4PR can be suppressed. In addition, when the first function layer 8 is a first electron transport layer and the second function layer 9 is a second electron transport layer different from the first electron transport layer, a display device including a plurality of light-emitting elements including different electron transport layers can be achieved.

Figure 16:
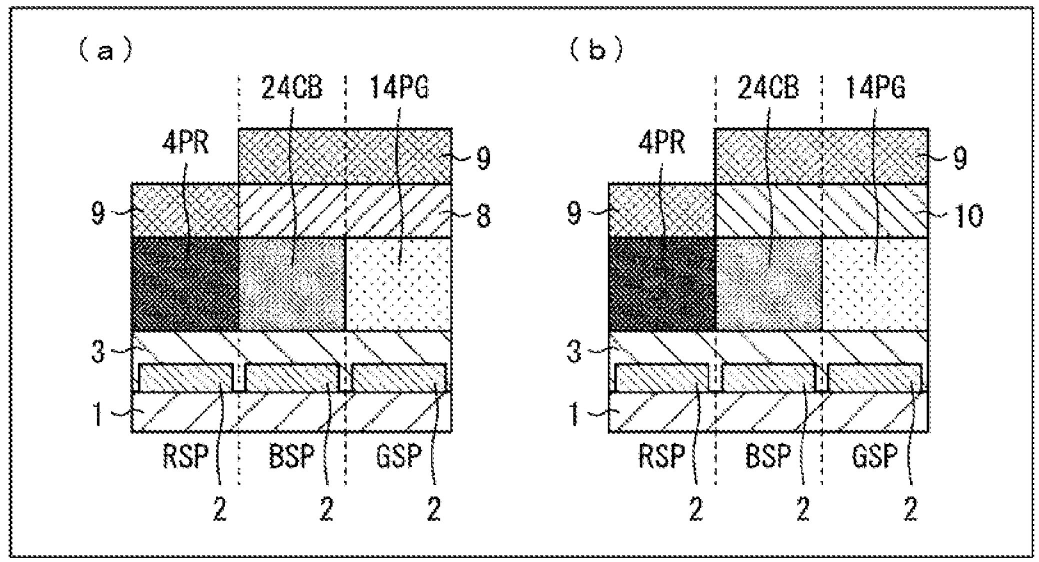
In FIG. 16, (a) is a cross-sectional view illustrating a schematic configuration of a part of another display device according to the eighth embodiment, and (b) is a cross-sectional view illustrating a schematic configuration of a part of a further different display device according to the eighth embodiment.

(a) of FIG. 16 is a cross-sectional view illustrating a schematic configuration of a part of another display device according to the eighth embodiment, and (b) of FIG. 16 is a cross-sectional view illustrating a schematic configuration of a part of a further different display device according to the eighth embodiment.

As illustrated in (a) of FIG. 16, the second function layer 9 is formed on the entire surface, that is, on a portion corresponding to the red subpixel RSP, a portion corresponding to the blue subpixel BSP, and a portion corresponding to the green subpixel GSP. By forming the second function layer 9 on the entire surface as described above, the steps of exposing and developing the second function layer 9 can be omitted, and thus, the manufacturing process can be simplified. In addition, when the first function layer 8 is a first electron transport layer and the second function layer 9 is a second electron transport layer different from the first electron transport layer, a display device including a plurality of light-emitting elements including two different electron transport layers can be achieved.

The first function layer 10 illustrated in (b) of FIG. 16 is a photo-curable resist. Note that since the first function layer 10 does not include a light-emitting material, color mixing does not occur between the first function layer 10 and the light-emitting layer that is the lower layer, and thus, a type of the solvent is not particularly limited. As illustrated in (b) of FIG. 16, the first function layer 10 is patterned at the portion corresponding to the blue subpixel BSP and the portion corresponding to the green subpixel GSP. Thereafter, the second function layer 9 is formed on the entire surface, that is, the portion corresponding to the red subpixel RSP, the portion corresponding to the blue subpixel BSP, and the portion corresponding to the green subpixel GSP. By forming the second function layer 9 on the entire surface as described above, the steps of exposing and developing the second function layer 9 can be omitted, and thus, the manufacturing process can be simplified. In addition, since the first function layer 10 that is a resist can be provided only at the light-emitting element with a specific color, carrier balancing of the light-emitting element of the specific color can be improved as necessary.

SUPPLEMENT

First Aspect

A method for manufacturing a display device including:
- forming a first light-emitting layer configured to emit light in a first color in at least a first region on a substrate by using a first solution including a first light-emitting material and a first solvent, and
- forming a second light-emitting layer configured to emit light in a second color different from the first color in at least a second region different from the first region on the substrate by using a second solution including a second light-emitting material and a second solvent in which a solubility of the first light-emitting material is less than a solubility of the first light-emitting material in the first solvent, the forming a second light-emitting layer being performed after the forming a first light-emitting layer, wherein the first light-emitting layer and the second light-emitting layer emit light in different regions.

Second Aspect

The method for manufacturing the display device according to aspect 1,
- wherein in the forming a second light-emitting layer, the second solvent comes into contact with the first light-emitting layer.

Third Aspect

The method for manufacturing the display device according to aspect 1 or 2,
- wherein one of the first solvent and the second solvent is a polar solvent, and
- the other of the first solvent and the second solvent is a non-polar solvent.

Fourth Aspect

The method for manufacturing the display device according to aspect 1 or 2,
- wherein the first solution includes a first core and a first ligand,
- the second solution includes a second core and a second ligand,
- one of the first ligand and the second ligand is a polar ligand, and
- the other of the first ligand and the second ligand is a non-polar ligand.

Fifth Aspect

The method for manufacturing the display device according to aspect 1 or 2,
- wherein one of the first light-emitting material and the second light-emitting material is a polar molecule, and
- the other of the first light-emitting material and the second light-emitting material is a non-polar molecule.

Sixth Aspect

The method for manufacturing the display device according to any one of aspects 1 to 5,
- wherein a Hildebrand solubility parameter (an SP value) of the first solvent and a Hildebrand solubility parameter (an SP value) of the second solvent are different by a value being equal to or greater than 0.1.

Seventh Aspect

The method for manufacturing the display device according to any one of aspects 1 to 6, wherein one of the first solvent and the second solvent is any one of propylene glycol monomethyl ether acetate (PGMEA), water, ethanol, isopropanol, methanol, and n-butanol, and the other of the first solvent and the second solvent is any one of octane, hexane, and toluene.

Eighth Aspect

The method for manufacturing the display device according to aspect 2, wherein in the forming a second light-emitting layer, a position where the second solvent comes into contact with the first light-emitting layer is a light-emitting region in a display region.

Ninth Aspect

The method for manufacturing the display device according to any one of aspects 1 to 8, wherein the first light-emitting layer in the first region is included in a first subpixel, the second light-emitting layer in the second region is included in a second subpixel, and the first subpixel and the second subpixel are included in one pixel of a display region.

Tenth Aspect

The method for manufacturing the display device according to aspect 9, wherein the first solution includes a photosensitive resin, and the second solution does not include a photosensitive resin.

Eleventh Aspect

The method for manufacturing the display device according to aspect 10, wherein the photosensitive resin included in the first solution is a positive-working photosensitive resin.

Twelfth Aspect

The method for manufacturing the display device according to aspect 1 or 2, further including:

forming a third light-emitting layer configured to emit light in a third color different from the first color and the second color in at least a third region different from the first region and the second region on the substrate by using a third solution including a third light-emitting material and a third solvent in which a solubility of the second light-emitting material is less than a solubility of the second light-emitting material in the second solvent, the forming a third light-emitting layer being performed after the forming a second light-emitting layer, wherein the third light-emitting layer emits light in a region different from regions of the first light-emitting layer and the second light-emitting layer.

Thirteenth Aspect

The method for manufacturing the display device according to aspect 12, wherein in the forming a third light-emitting layer, the third solvent comes into contact with the second light-emitting layer.

Fourteenth Aspect

The method for manufacturing the display device according to aspect 12 or 13, wherein the first solvent and the third solvent are one of a polar solvent and a non-polar solvent, and the second solvent is the other of the polar solvent and the non-polar solvent.

Fifteenth Aspect

The method for manufacturing the display device according to aspect 12 or 13, wherein the first solution includes a first core and a first ligand, the second solution includes a second core and a second ligand, the third solution includes a third core and a third ligand, the first ligand and the third ligand are one of a polar ligand and a non-polar ligand, and the second ligand is the other of the polar ligand and the non-polar ligand.

Sixteenth Aspect

The method for manufacturing the display device according to aspect 12 or 13, wherein the first light-emitting material and the third light-emitting material are one of a polar molecule and a non-polar molecule, and the second light-emitting material is the other of the polar molecule and the non-polar molecule.

Seventeenth Aspect

The method for manufacturing the display device according to any one of aspects 12 to 16, wherein a Hildebrand solubility parameter (an SP value) of each of the first solvent and the third solvent is different from a Hildebrand solubility parameter (an SP value) of the second solvent by a value being equal to or greater than 0.1.

Eighteenth Aspect

The method for manufacturing the display device according to any one of aspects 12 to 17, wherein each of the first solvent and the third solvent is any one of propylene glycol monomethyl ether acetate (PGMEA), water, ethanol, isopropanol, methanol, and n-butanol, and the second solvent is any one of octane, hexane and toluene.

Nineteenth Aspect

The method for manufacturing the display device according to any one of aspects 12 to 17, wherein each of the first solvent and the third solvent is any one of octane, hexane, and toluene, and the second solvent is any one of propylene glycol monomethyl ether acetate (PGMEA), water, ethanol, isopropanol, methanol, and n-butanol.

Twentieth Aspect

The method for manufacturing the display device according to aspect 13, wherein in the forming a third light-emitting layer, a position at which the third solvent comes into contact with the second light-emitting layer is a light-emitting region in a display region.

Twenty-First Aspect

The method for manufacturing the display device according to any one of aspects 12 to 20, wherein the first light-emitting layer in the first region is included in a first subpixel, the second light-emitting layer in the second region is included in a second subpixel, the third light-emitting layer in the third region is included in a third subpixel, and the first subpixel, the second subpixel, and the third subpixel are included in one pixel of a display region.

Twenty-Second Aspect

The method for manufacturing the display device according to aspect 21, wherein each of the first solution and the third solution includes a photosensitive resin, and the second solution does not include a photosensitive resin.

Twenty-Third Aspect

The method for manufacturing the display device according to aspect 22, wherein the photosensitive resin included in the first solution is a positive-working photosensitive resin, and the photosensitive resin included in the third solution is a positive-working or negative-working photosensitive resin.

Twenty-Fourth Aspect

The method for manufacturing the display device according to aspect 23, wherein the photosensitive resin included in the third solution is a positive-working photosensitive resin, and the forming a first light-emitting layer includes:

applying the first solution to a portion corresponding to the first subpixel, a portion corresponding to the second subpixel, and a portion corresponding to the third subpixel, and first patterning including exposing and developing a portion corresponding to the second subpixel of a film formed by applying the first solution, and thus, removing the portion corresponding to the second subpixel of the film formed by applying the first solution, the forming a second light-emitting layer includes:

applying the second solution to the portion corresponding to the first subpixel, the portion corresponding to the second subpixel, and the portion corresponding to the third subpixel, and second patterning including exposing and developing a portion corresponding to the third subpixel of a first layered film obtained by layering the film formed by applying the first solution and a film formed by applying the second solution, and thus, removing the portion corresponding to the third subpixel of the first layered film, and the forming a third light-emitting layer includes:

applying the third solution to the portion corresponding to the first subpixel, the portion corresponding to the second subpixel, and the portion corresponding to the third subpixel, and exposing and developing a portion corresponding to the first subpixel of a second layered film obtained by layering the film formed by applying the first solution, the film formed by applying the second solution, and a film formed by applying the third solution, and a portion corresponding to the second subpixel of a third layered film obtained by layering the film formed by applying the second solution and the film formed by applying the third solution, and thus, forming the first light-emitting layer in the first subpixel, the second light-emitting layer in the second subpixel, and the third light-emitting layer in the third subpixel.

Twenty-Fifth Aspect

The method for manufacturing the display device according to aspect 23, wherein a solubility of the first light-emitting material in the third solvent is less than the solubility of the first light-emitting material in the first solvent, the forming a first light-emitting layer includes:

applying the first solution to a portion corresponding to the first subpixel, a portion corresponding to the second subpixel, and a portion corresponding to the third subpixel, first patterning including exposing and developing a portion corresponding to the second subpixel of a film formed by applying the first solution, and thus, removing the portion corresponding to the second subpixel of the film formed by applying the first solution, and forming a peeling layer constituted by a water soluble resin that is to be peeled by development on a portion corresponding to the first subpixel of the film formed by applying the first solution after the forming a first light-emitting layer and before the forming a second light-emitting layer, the forming a second light-emitting layer includes:

applying the second solution to the portion corresponding to the first subpixel, the portion corresponding to the second subpixel, and the portion corresponding to the third subpixel, and second patterning including exposing and developing a portion corresponding to the third subpixel of a first layered film obtained by layering the film formed by applying the first solution and a film formed by applying the second solution, and thus, removing the portion corresponding to the third subpixel of the first layered film, the peeling layer, and the film formed by applying the second solution on the peeling layer, and the forming a third light-emitting layer includes:

applying the third solution to the portion corresponding to the first subpixel, the portion corresponding to the second subpixel, and the portion corresponding to the third subpixel, and forming the first light-emitting layer in the first subpixel, the second light-emitting layer in the second subpixel, and the third light-emitting layer in the third subpixel, by exposing and developing.

Twenty-Sixth Aspect

The method for manufacturing the display device according to aspect 23, wherein the forming a first light-emitting layer includes:

applying the first solution to a portion corresponding to the first subpixel, a portion corresponding to the second subpixel, and a portion corresponding to the third subpixel, and first patterning including exposing and developing a portion corresponding to the second subpixel of a film formed by applying the first solution, and thus, removing the portion corresponding to the second subpixel of the film formed by applying the first solution, the forming a second light-emitting layer includes:

applying the second solution to the portion corresponding to the first subpixel, the portion corresponding to the second subpixel, and the portion corresponding to the third subpixel, and second patterning including exposing and developing a portion corresponding to the third subpixel of a first layered film obtained by layering the film formed by applying the first solution and a film formed by applying the second solution, and thus, removing the portion corresponding to the third subpixel of the first layered film, the forming a third light-emitting layer includes:

applying the third solution to the portion corresponding to the first subpixel, the portion corresponding to the second subpixel, and the portion corresponding to the third subpixel, and forming the first layered film including the first light-emitting layer and the second light-emitting layer in the first subpixel, the second light-emitting layer in the second subpixel, and the third light-emitting layer in the third subpixel, by exposing and developing, and a light emission peak wavelength of the second light-emitting layer is shorter than a light emission peak wavelength of the first light-emitting layer and a light emission peak wavelength of the third light-emitting layer.

Twenty-Seventh Aspect

The method for manufacturing the display device according to aspect 23, wherein the forming a first light-emitting layer includes:

applying the first solution to a portion corresponding to the first subpixel, a portion corresponding to the second subpixel, and a portion corresponding to the third subpixel, and first patterning including exposing and developing a portion corresponding to the second subpixel of a film formed by applying the first solution, and thus, removing the portion corresponding to the second subpixel of the film formed by applying the first solution, the forming a second light-emitting layer includes:

applying the second solution to the portion corresponding to the first subpixel, the portion corresponding to the second subpixel, and the portion corresponding to the third subpixel, and second patterning including exposing and developing a portion corresponding to the third subpixel of a first layered film obtained by layering the film formed by applying the first solution and a film formed by applying the second solution, and thus, removing the portion corresponding to the third subpixel of the first layered film, the forming a third light-emitting layer includes:

applying the third solution to the portion corresponding to the first subpixel, the portion corresponding to the second subpixel, and the portion corresponding to the third subpixel, and forming the first layered film including the first light-emitting layer and the second light-emitting layer in the first subpixel, the second light-emitting layer in the second subpixel, and the third light-emitting layer in the third subpixel, by exposing and developing, and a light emission peak wavelength of the second light-emitting layer is longer than a light emission peak wavelength of the first light-emitting layer.

Twenty-Eighth Aspect

The method for manufacturing the display device according to aspect 23, wherein the forming a first light-emitting layer includes:

applying the first solution to a portion corresponding to the first subpixel, a portion corresponding to the second subpixel, and a portion corresponding to the third subpixel, and first patterning including exposing and developing a portion corresponding to the second subpixel of a film formed by applying the first solution, and thus, removing the portion corresponding to the second subpixel of the film formed by applying the first solution, the forming a second light-emitting layer includes:

applying the second solution to the portion corresponding to the first subpixel, the portion corresponding to the second subpixel, and the portion corresponding to the third subpixel, and second patterning including exposing and developing a portion corresponding to the third subpixel of a first layered film obtained by layering the film formed by applying the first solution and a film formed by applying the second solution, and thus, removing the portion corresponding to the third subpixel of the first layered film, the forming a third light-emitting layer includes:

applying the third solution to the portion corresponding to the first subpixel, the portion corresponding to the second subpixel, and the portion corresponding to the third subpixel, and forming the first layered film including the first light-emitting layer and the second light-emitting layer in the first subpixel, the second light-emitting layer in the second subpixel, and the third light-emitting layer in the third subpixel, by exposing and developing, and a light emission peak wavelength of the first light-emitting layer is longer than a light emission peak wavelength of the second light-emitting layer.

Twenty-Ninth Aspect

The method for manufacturing the display device according to aspect 23, wherein the forming a first light-emitting layer includes:

applying the first solution to a portion corresponding to the first subpixel, a portion corresponding to the second subpixel, and a portion corresponding to the third subpixel, and first patterning including exposing and developing a portion corresponding to the second subpixel of a film formed by applying the first solution, and thus, removing the portion corresponding to the second subpixel of the film formed by applying the first solution, the forming a second light-emitting layer includes:

applying the second solution to the portion corresponding to the first subpixel, the portion corresponding to the second subpixel, and the portion corresponding to the third subpixel, and second patterning including exposing and developing a portion corresponding to the third subpixel of a first layered film obtained by layering the film formed by applying the first solution and a film formed by applying the second solution, and thus, removing the portion corresponding to the third subpixel of the first layered film, the forming a third light-emitting layer includes:

applying the third solution to the portion corresponding to the first subpixel, the portion corresponding to the second subpixel, and the portion corresponding to the third subpixel, and forming a second layered film including the first light-emitting layer, the second light-emitting layer, and the third light-emitting layer in the first subpixel, a third layered film including the second light-emitting layer and the third light-emitting layer in the second subpixel, and the third light-emitting layer in the third subpixel, a light emission peak wavelength of the first light-emitting layer is shorter than a light emission peak wavelength of the second light-emitting layer, and the light emission peak wavelength of the second light-emitting layer is shorter than a light emission peak wavelength of the third light-emitting layer.

Thirtieth Aspect

The method for manufacturing the display device according to aspect 23, wherein the forming a first light-emitting layer includes:

applying the first solution to a portion corresponding to the first subpixel, a portion corresponding to the second subpixel, and a portion corresponding to the third subpixel, and first patterning including exposing and developing a portion corresponding to the second subpixel of a film formed by applying the first solution, and thus, removing the portion corresponding to the second subpixel of the film formed by applying the first solution, the forming a second light-emitting layer includes:

applying the second solution to the portion corresponding to the first subpixel, the portion corresponding to the second subpixel, and the portion corresponding to the third subpixel, and second patterning including exposing and developing a portion corresponding to the third subpixel of a first layered film obtained by layering the film formed by applying the first solution and a film formed by applying the second solution, and thus, removing the portion corresponding to the third subpixel of the first layered film, the forming a third light-emitting layer includes:

applying the third solution to the portion corresponding to the first subpixel, the portion corresponding to the second subpixel, and the portion corresponding to the third subpixel, and forming a second layered film including the first light-emitting layer, the second light-emitting layer, and the third light-emitting layer in the first subpixel, a third layered film including the second light-emitting layer and the third light-emitting layer in the second subpixel, and the third light-emitting layer in the third subpixel, a light emission peak wavelength of the second light-emitting layer is shorter than a light emission peak wavelength of the first light-emitting layer, and a light emission peak wavelength of the third light-emitting layer is shorter than the light emission peak wavelength of the second light-emitting layer.

Thirty-First Aspect

The method for manufacturing the display device according to aspect 23, wherein the photosensitive resin included in the third solution is a positive-working photosensitive resin, the forming a first light-emitting layer includes:

applying the first solution to a portion corresponding to the first subpixel, a portion corresponding to the second subpixel, and a portion corresponding to the third subpixel, and first patterning including exposing and developing a portion corresponding to the second subpixel of a film formed by applying the first solution, and thus, removing the portion corresponding to the second subpixel of the film formed by applying the first solution, the forming a second light-emitting layer includes:

applying the second solution to the portion corresponding to the first subpixel, the portion corresponding to the second subpixel, and the portion corresponding to the third subpixel, and second patterning including exposing and developing a portion corresponding to the third subpixel of a first layered film obtained by layering the film formed by applying the first solution and a film formed by applying the second solution, and thus, removing the portion corresponding to the third subpixel of the first layered film, the forming a third light-emitting layer includes:

applying the third solution to the portion corresponding to the first subpixel, the portion corresponding to the second subpixel, and the portion corresponding to the third subpixel, exposing and developing a portion corresponding to the first subpixel of a second layered film obtained by layering the film formed by applying the first solution, the film formed by applying the second solution, and a film formed by applying the third solution, and thus, removing the film formed by applying the third solution in the second layered film, removing the film formed by applying the second solution at the portion corresponding to the first subpixel by washing with a solvent in which a solubility of the second light-emitting material is higher than solubilities of the first light-emitting material and the third light-emitting material, and exposing and developing a portion corresponding to the second subpixel of a third layered film obtained by layering the film formed by applying the second solution and the film formed by applying the third solution, and thus, forming the first light-emitting layer in the first subpixel, the second light-emitting layer in the second subpixel, and the third light-emitting layer in the third subpixel.

Thirty-Second Aspect

The method for manufacturing the display device according to aspect 23, wherein the forming a first light-emitting layer further includes:

applying the first solution to a portion corresponding to the first subpixel, a portion corresponding to the second subpixel, and a portion corresponding to the third subpixel, and first patterning including exposing and developing a portion corresponding to the second subpixel of a film formed by applying the first solution, and thus, removing the portion corresponding to the second subpixel of the film formed by applying the first solution, the forming a second light-emitting layer includes:

applying the second solution to the portion corresponding to the first subpixel, the portion corresponding to the second subpixel, and the portion corresponding to the third subpixel, and second patterning including exposing and developing a portion corresponding to the third subpixel of a first layered film obtained by layering the film formed by applying the first solution and a film formed by applying the second solution, and thus, removing the portion corresponding to the third subpixel of the first layered film, the forming a third light-emitting layer includes:

applying the third solution to the portion corresponding to the first subpixel, the portion corresponding to the second subpixel, and the portion corresponding to the third subpixel, and removing a film formed by applying the third solution at a portion corresponding to the first subpixel of a second layered film obtained by layering the film formed by applying the first solution, the film formed by applying the second solution, and a film formed by applying the third solution, and a film formed by applying the third solution at a portion corresponding to the second subpixel of a third layered film obtained by layering the film formed by applying the second solution, and the film formed by applying the third solution, by exposing and developing, and after the forming a third light-emitting layer, forming a first function layer at the portion corresponding to the second subpixel and the portion corresponding to the third subpixel, removing the film formed by applying the second solution at the portion corresponding to the first subpixel by using the first function layer as a mask, and forming a second function layer at least at a position where the film formed by applying the second solution at the portion corresponding to the first subpixel is removed.

Thirty-Third Aspect

The method for manufacturing the display device according to aspect 12 or 13, wherein a solubility of the first light-emitting material in the third solvent is less than a solubility of the first light-emitting material in the first solvent, the first light-emitting layer is included in a first subpixel, the second light-emitting layer is included in a second subpixel, the third light-emitting layer is included in a third subpixel, the first subpixel, the second subpixel, and the third subpixel are included in one pixel of a display region, the second subpixel is adjacent to both the first subpixel and the third subpixel in the one pixel, each of the first solution and the third solution includes a photosensitive resin, the second solution does not include a photosensitive resin, the photosensitive resin included in the first solution is a positive-working photosensitive resin, the photosensitive resin included in the third solution is a positive-working or negative-working photosensitive resin, the forming a first light-emitting layer includes:

applying the first solution to a portion corresponding to the first subpixel, a portion corresponding to the second subpixel, and a portion corresponding to the third subpixel, and first patterning including exposing and developing a portion corresponding to the second subpixel of a film formed by applying the first solution, and thus, removing the portion corresponding to the second subpixel of the film formed by applying the first solution, the forming a second light-emitting layer includes:

dropping the second solution onto the portion corresponding to the second subpixel, and second patterning including exposing and developing a portion corresponding to the third subpixel of the film formed by applying the first solution, and thus, removing the portion corresponding to the third subpixel of the film formed by applying the first solution, after the forming a second light-emitting layer, and the forming a third light-emitting layer includes:

applying the third solution to the portion corresponding to the first subpixel, the portion corresponding to the second subpixel, and the portion corresponding to the third subpixel, and forming the first light-emitting layer in the first subpixel, the second light-emitting layer in the second subpixel, and the third light-emitting layer in the third subpixel, by exposing and developing.

Thirty-Fourth Aspect

The method for manufacturing the display device according to any one of aspects 1 to 33, wherein firing is performed only once after all the light-emitting layers are formed.

Thirty-Fifth Aspect

The method for manufacturing the display device according to any one of aspects 1 to 34, further including:

forming a dissolution preventing layer, wherein the forming a dissolution preventing layer is to be performed before the forming a first light-emitting layer.

Thirty-Sixth Aspect

A display device including:

a first light-emitting layer including a first light-emitting material, the first light-emitting layer being configured to emit light in a first color, and a second light-emitting layer including a second light-emitting material, the second light-emitting layer being configured to emit light in a second color different from the first color, wherein the first light-emitting layer and the second light-emitting layer are in contact with each other, one of the first light-emitting material and the second light-emitting material is a polar molecule, the other of the first light-emitting material and the second light-emitting material is a non-polar molecule, and the first light-emitting layer and the second light-emitting layer emit light in different regions.

Thirty-Seventh Aspect

The display device according to aspect 36 further including:

a third light-emitting layer including a third light-emitting material, the third light-emitting layer being configured to emit light in a third color different from the first color and the second color, wherein the third light-emitting layer is in contact with the second light-emitting layer, the first light-emitting material and the third light-emitting material are one of a polar molecule and a non-polar molecule, and the second light-emitting material is the other of the polar molecule and the non-polar molecule.

Thirty-Eighth Aspect

The display device according to aspect 37, wherein the first light-emitting material includes a first core and a first ligand, the second light-emitting material includes a second core and a second ligand, and the third light-emitting material includes a third core and a third ligand.

Thirty-Ninth Aspect

The display device according to aspect 37 or 38, wherein each of a position at which the first light-emitting layer and the second light-emitting layer are in contact with each other and a position at which the second light-emitting layer and the third light-emitting layer are in contact with each other is a light-emitting region in a display region.

Fortieth Aspect

The display device according to any one of aspects 37 to 39, wherein the first light-emitting layer is included in a first subpixel, the second light-emitting layer is included in a second subpixel, the third light-emitting layer is included in a third subpixel, and the first subpixel, the second subpixel, and the third subpixel are included in one pixel of a display region.

Forty-First Aspect

A display device including:

a first light-emitting layer including a first light-emitting material, the first light-emitting layer being configured to emit light in a first color, a second light-emitting layer including a second light-emitting material, the second light-emitting layer being configured to emit light in a second color different from the first color, wherein the first light-emitting layer and the second light-emitting layer are in contact with each other, and a Hildebrand solubility parameter (an SP value) of the first light-emitting material and a Hildebrand solubility parameter (an SP value) of the second light-emitting material are different from each other by a value being equal to or greater than 0.1.

APPENDIX

The disclocure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

INDUSTRIAL APPLICABILITY

The disclosure can be utilized for a display device, a method for manufacturing the display device, and the like.

The invention claimed is:

1. A method for manufacturing a display device, the method comprising:

forming a first light-emitting layer, configured to emit light in a first color, in at least a first region on a substrate by using a first solution including a first light-emitting material and a first solvent;

forming a second light-emitting layer, configured to emit light in a second color different from the first color, in at least a second region different from the first region on the substrate by using a second solution including a second light-emitting material and a second solvent in which a solubility of the first light-emitting material is less than a solubility of the first light-emitting material in the first solvent, forming the second light-emitting layer being performed after forming the first light-emitting layer; and forming a third light-emitting layer, configured to emit light in a third color different from the first color and the second color, in at least a third region different from the first region and the second region on the substrate by using a third solution including a third light-emitting material and a third solvent in which a solubility of the second light-emitting material is less than a solubility of the second light-emitting material in the second solvent, forming the third light-emitting layer being performed after forming the second light-emitting layer, wherein the first light-emitting layer and the second light-emitting layer emit light in different regions, and the third light-emitting layer emits light in a region different from regions of the first light-emitting layer and the second light-emitting layer.

2. The method according to claim 1,
wherein the first solvent and the third solvent are one of a polar solvent and a non-polar solvent, and
the second solvent is the other one of the polar solvent and the non-polar solvent.

3. The method according to claim 1,
wherein the first solution includes a first core and a first ligand,
the second solution includes a second core and a second ligand,
the third solution includes a third core and a third ligand,
the first ligand and the third ligand are one of a polar ligand and a non-polar ligand, and
the second ligand is the other one of the polar ligand and the non-polar ligand.

4. The method according to claim 1,
wherein each of the first solvent and the third solvent is any one of propylene glycol monomethyl ether acetate (PGMEA), water, ethanol, isopropanol, methanol, and n-butanol, and
the second solvent is any one of octane, hexane, and toluene.

5. The method according to claim 1,
wherein each of the first solvent and the third solvent is any one of octane, hexane, and toluene, and
the second solvent is any one of propylene glycol monomethyl ether acetate (PGMEA), water, ethanol, isopropanol, methanol, and n-butanol.

6. The method according to claim 1,
wherein the first light-emitting layer in the first region is included in a first subpixel,
the second light-emitting layer in the second region is included in a second subpixel,
the third light-emitting layer in the third region is included in a third subpixel,
the first subpixel, the second subpixel, and the third subpixel are included in one pixel of a display region,
each of the first solution and the third solution includes a photosensitive resin, and
the second solution does not include the photosensitive resin.

7. The method according to claim 6,
wherein the photosensitive resin included in the first solution is a positive-working photosensitive resin, and
the photosensitive resin included in the third solution is the positive-working photosensitive resin or a negative-working photosensitive resin.

8. The method according to claim 7,
wherein the photosensitive resin included in the third solution is the positive-working photosensitive resin,
forming the first light-emitting layer includes;
applying the first solution to a portion corresponding to the first subpixel, a portion corresponding to the second subpixel, and a portion corresponding to the third subpixel, and
first patterning including exposing and developing a portion corresponding to the second subpixel of a first film formed by applying the first solution, and removing the portion corresponding to the second subpixel of the first film,
forming the second light-emitting layer includes:
applying the second solution to the portion corresponding to the first subpixel, the portion corresponding to the second subpixel, and the portion corresponding to the third subpixel, and
second patterning including exposing and developing a portion corresponding to the third subpixel of a first layered film obtained by layering the first film and a second film formed by applying the second solution, and removing the portion corresponding to the third subpixel of the first layered film, and
forming the third light-emitting layer includes:
applying the third solution to the portion corresponding to the first subpixel, the portion corresponding to the second subpixel, and the portion corresponding to the third subpixel,
exposing and developing a portion corresponding to the first subpixel of a second layered film obtained by layering the first film, the second film, and a third film formed by applying the third solution, and a portion corresponding to the second subpixel of a third layered film obtained by layering the second film and the third film, and
forming the first light-emitting layer in the first subpixel, the second light-emitting layer in the second subpixel, and the third light-emitting layer in the third subpixel.

9. The method according to claim 7,
wherein a solubility of the first light-emitting material in the third solvent is less than the solubility of the first light-emitting material in the first solvent,
forming the first light-emitting layer includes:
applying the first solution to a portion corresponding to the first subpixel, a portion corresponding to the second subpixel, and a portion corresponding to the third subpixel,
first patterning including exposing and developing a portion corresponding to the second subpixel of a first film formed by applying the first solution, and removing the portion corresponding to the second subpixel of the first film, and
forming a peeling layer, formed by a water soluble resin that is to be peeled by development on a portion corresponding to the first subpixel of the first film, after forming the first light-emitting layer and before forming the second light-emitting layer,
forming the second light-emitting layer includes:
applying the second solution to the portion corresponding to the first subpixel, the portion corresponding to the second subpixel, and the portion corresponding to the third subpixel, and
second patterning including exposing and developing a portion corresponding to the third subpixel of a first layered film obtained by layering the first film, the peeling layer, and a second film formed by applying the second solution, and removing the portion corresponding to the third subpixel of the first layered film, the peeling layer, and the second film on the peeling layer, and
forming the third light-emitting layer includes;
applying the third solution to the portion corresponding to the first subpixel, the portion corresponding to the second subpixel, and the portion corresponding to the third subpixel, and
forming the first light-emitting layer in the first subpixel, the second light-emitting layer in the second subpixel, and the third light-emitting layer in the third subpixel, by exposing and developing.

10. The method according to claim 7, wherein forming the first light-emitting layer includes:

applying the first solution to a portion corresponding to the first subpixel, a portion corresponding to the second subpixel, and a portion corresponding to the third subpixel, and first patterning including exposing and developing a portion corresponding to the second subpixel of a first film formed by applying the first solution, and removing the portion corresponding to the second subpixel of the first film, forming the second light-emitting layer includes:

applying the second solution to the portion corresponding to the first subpixel, the portion corresponding to the second subpixel, and the portion corresponding to the third subpixel, and second patterning including exposing and developing a portion corresponding to the third subpixel of a first layered film obtained by layering the first film and a second film formed by applying the second solution, and removing the portion corresponding to the third subpixel of the first layered film, forming the third light-emitting layer includes:

applying the third solution to the portion corresponding to the first subpixel, the portion corresponding to the second subpixel, and the portion corresponding to the third subpixel, and forming the first layered film including the first light-emitting layer and the second light-emitting layer in the first subpixel, the second light-emitting layer in the second subpixel, and the third light-emitting layer in the third subpixel, by exposing and developing, and a light emission peak wavelength of the second light-emitting layer is shorter than a light emission peak wavelength of the first light-emitting layer and a light emission peak wavelength of the third light-emitting layer.

11. The method according to claim 7, wherein forming the first light-emitting layer includes;

applying the first solution to a portion corresponding to the first subpixel, a portion corresponding to the second subpixel, and a portion corresponding to the third subpixel, and first patterning including exposing and developing a portion corresponding to the second subpixel of a first film formed by applying the first solution, and removing the portion corresponding to the second subpixel of the first film, forming the second light-emitting layer includes:

applying the second solution to the portion corresponding to the first subpixel, the portion corresponding to the second subpixel, and the portion corresponding to the third subpixel, and second patterning including exposing and developing a portion corresponding to the third subpixel of a first layered film obtained by layering the first film and a second film formed by applying the second solution, and removing the portion corresponding to the third subpixel of the first layered film, forming the third light-emitting layer includes:

applying the third solution to the portion corresponding to the first subpixel, the portion corresponding to the second subpixel, and the portion corresponding to the third subpixel, and forming the first layered film including the first light-emitting layer and the second light-emitting layer in the first subpixel, the second light-emitting layer in the second subpixel, and the third light-emitting layer in the third subpixel, by exposing and developing, and a light emission peak wavelength of the second light-emitting layer is longer than a light emission peak wavelength of the first light-emitting layer.

12. The method according to claim 7, wherein forming the first light-emitting layer includes;

applying the first solution to a portion corresponding to the first subpixel, a portion corresponding to the second subpixel, and a portion corresponding to the third subpixel, and first patterning including exposing and developing a portion corresponding to the second subpixel of a first film formed by applying the first solution, and removing the portion corresponding to the second subpixel of the first film, forming the second light-emitting layer includes:

applying the second solution to the portion corresponding to the first subpixel, the portion corresponding to the second subpixel, and the portion corresponding to the third subpixel, and second patterning including exposing and developing a portion corresponding to the third subpixel of a first layered film obtained by layering the first film and a second film formed by applying the second solution, and removing the portion corresponding to the third subpixel of the first layered film, forming the third light-emitting layer includes:

applying the third solution to the portion corresponding to the first subpixel, the portion corresponding to the second subpixel, and the portion corresponding to the third subpixel, and forming the first layered film including the first light-emitting layer and the second light-emitting layer in the first subpixel, the second light-emitting layer in the second subpixel, and the third light-emitting layer in the third subpixel, by exposing and developing, and a light emission peak wavelength of the first light-emitting layer is longer than a light emission peak wavelength of the second light-emitting layer.

13. The method according to claim 7, wherein forming the first light-emitting layer includes:

applying the first solution to a portion corresponding to the first subpixel, a portion corresponding to the second subpixel, and a portion corresponding to the third subpixel, and first patterning including exposing and developing a portion corresponding to the second subpixel of a first film formed by applying the first solution, and removing the portion corresponding to the second subpixel of the first film, forming the second light-emitting layer includes;

applying the second solution to the portion corresponding to the first subpixel, the portion corresponding to the second subpixel, and the portion corresponding to the third subpixel, and second patterning including exposing and developing a portion corresponding to the third subpixel of a first layered film obtained by layering the first film and a second film formed by applying the second solution, and removing the portion corresponding to the third subpixel of the first layered film, forming the third light-emitting layer includes:

applying the third solution to the portion corresponding to the first subpixel, the portion corresponding to the second subpixel, and the portion corresponding to the third subpixel, and forming a second layered film including the first light-emitting layer, the second light-emitting layer, and the third light-emitting layer in the first subpixel, a third layered film including the second light-emitting layer and the third light-emitting layer in the second subpixel, and the third light-emitting layer in the third subpixel, a light emission peak wavelength of the first light-emitting layer is shorter than a light emission peak wavelength of the second light-emitting layer, and the light emission peak wavelength of the second light-emitting layer is shorter than a light emission peak wavelength of the third light-emitting layer.

14. The method according to claim 7, wherein forming the first light-emitting layer includes:

applying the first solution to a portion corresponding to the first subpixel, a portion corresponding to the second subpixel, and a portion corresponding to the third subpixel, and first patterning including exposing and developing a portion corresponding to the second subpixel of a first film formed by applying the first solution, and removing the portion corresponding to the second subpixel of the first film, forming the second light-emitting layer includes:

applying the second solution to the portion corresponding to the first subpixel, the portion corresponding to the second subpixel, and the portion corresponding to the third subpixel, and second patterning including exposing and developing a portion corresponding to the third subpixel of a first layered film obtained by layering the first film and a second film formed by applying the second solution, and removing the portion corresponding to the third subpixel of the first layered film, forming the third light-emitting layer includes:

applying the third solution to the portion corresponding to the first subpixel, the portion corresponding to the second subpixel, and the portion corresponding to the third subpixel, and forming a second layered film including the first light-emitting layer, the second light-emitting layer, and the third light-emitting layer in the first subpixel, a third layered film including the second light-emitting layer and the third light-emitting layer in the second subpixel, and the third light-emitting layer in the third subpixel, a light emission peak wavelength of the second light-emitting layer is shorter than a light emission peak wavelength of the first light-emitting layer, and a light emission peak wavelength of the third light-emitting layer is shorter than the light emission peak wavelength of the second light-emitting layer.

15. The method according to claim 7, wherein the photosensitive resin included in the third solution is the positive-working photosensitive resin, forming the first light-emitting layer includes;

applying the first solution to a portion corresponding to the first subpixel, a portion corresponding to the second subpixel, and a portion corresponding to the third subpixel, and first patterning including exposing and developing a portion corresponding to the second subpixel of a first film formed by applying the first solution, and removing the portion corresponding to the second subpixel of the first film, forming the second light-emitting layer includes:

applying the second solution to the portion corresponding to the first subpixel, the portion corresponding to the second subpixel, and the portion corresponding to the third subpixel, and second patterning including exposing and developing a portion corresponding to the third subpixel of a first layered film obtained by layering the first film and a second film formed by applying the second solution, and removing the portion corresponding to the third subpixel of the first layered film, and forming the third light-emitting layer includes:

applying the third solution to the portion corresponding to the first subpixel, the portion corresponding to the second subpixel, and the portion corresponding to the third subpixel, exposing and developing a portion corresponding to the first subpixel of a second layered film obtained by layering the first film, the second film, and a third film formed by applying the third solution, and removing the third film in the second layered film, removing the second film at the portion corresponding to the first subpixel by washing with a solvent in which a solubility of the second light-emitting material is higher than solubilities of the first light-emitting material and the third light-emitting material, exposing and developing a portion corresponding to the second subpixel of a third layered film obtained by layering the second film and the third film, and forming the first light-emitting layer in the first subpixel, the second light-emitting layer in the second subpixel, and the third light-emitting layer in the third subpixel.

16. The method according to claim 7, wherein forming the first light-emitting layer includes;

applying the first solution to a portion corresponding to the first subpixel, a portion corresponding to the second subpixel, and a portion corresponding to the third subpixel, and first patterning including exposing and developing a portion corresponding to the second subpixel of a first film formed by applying the first solution, and removing the portion corresponding to the second subpixel of the first film, forming the second light-emitting layer includes:

applying the second solution to the portion corresponding to the first subpixel, the portion corresponding to the second subpixel, and the portion corresponding to the third subpixel, and second patterning including exposing and developing a portion corresponding to the third subpixel of a first layered film obtained by layering the first film and a second film formed by applying the second solution, and removing the portion corresponding to the third subpixel of the first layered film, forming the third light-emitting layer includes;

applying the third solution to the portion corresponding to the first subpixel, the portion corresponding to the second subpixel, and the portion corresponding to the third subpixel, and removing a third film formed by applying the third solution at a portion corresponding to the first subpixel of a second layered film obtained by layering the first film, the second film, and the third film, and removing a fourth film formed by applying the third solution at a portion corresponding to the second subpixel of a third layered film obtained by layering the second film, and the fourth film, by exposing and developing, and after forming the third light-emitting layer, the method further comprises:

forming a first function layer at the portion corresponding to the second subpixel and the portion corresponding to the third subpixel;

removing the second film at the portion corresponding to the first subpixel by using the first function layer as a mask; and forming a second function layer, at least, at a position where the second film at the portion corresponding to the first subpixel is removed.

17. The method according to claim 1, wherein a solubility of the first light-emitting material in the third solvent is less than the solubility of the first light-emitting material in the first solvent, the first light-emitting layer is included in a first subpixel, the second light-emitting layer is included in a second subpixel, the third light-emitting layer is included in a third subpixel, the first subpixel, the second subpixel, and the third subpixel are included in one pixel of a display region, the second subpixel is adjacent to both the first subpixel and the third subpixel in the one pixel, each of the first solution and the third solution includes a photosensitive resin, the second solution does not include the photosensitive resin, the photosensitive resin included in the first solution is a positive-working photosensitive resin, the photosensitive resin included in the third solution is the positive-working photosensitive resin or a negative-working photosensitive resin, forming the first light-emitting layer includes:

applying the first solution to a portion corresponding to the first subpixel, a portion corresponding to the second subpixel, and a portion corresponding to the third subpixel, and first patterning including exposing and developing a portion corresponding to the second subpixel of a first film formed by applying the first solution, and removing the portion corresponding to the second subpixel of the first film, forming the second light-emitting layer includes:

applying the second solution to the portion corresponding to the second subpixel, and second patterning including exposing and developing a portion corresponding to the third subpixel of the first film, and removing the portion corresponding to the third subpixel of the first film after forming the second light-emitting layer, and forming the third light-emitting layer includes:

applying the third solution to the portion corresponding to the first subpixel, the portion corresponding to the second subpixel, and the portion corresponding to the third subpixel, and forming the first light-emitting layer in the first subpixel, the second light-emitting layer in the second subpixel, and the third light-emitting layer in the third subpixel, by exposing and developing.

18. A display device comprising:

a first light-emitting layer including a first light-emitting material, the first light-emitting layer being configured to emit light in a first color;

a second light-emitting layer including a second light-emitting material, the second light-emitting layer being configured to emit light in a second color different from the first color; and a third light-emitting layer including a third light-emitting material, the third light-emitting layer being configured to emit light in a third color different from the first color and the second color, wherein the first light-emitting layer and the second light-emitting layer are in contact with each other, the first light-emitting layer and the second light-emitting layer emit light in different regions, the third light-emitting layer is in contact with the second light emitting layer, the first light-emitting material and the third light-emitting material include one of a polar molecule and a non-polar molecule, the second light-emitting material includes the other one of the polar molecule and the non-polar molecule, the first light-emitting layer is included in a first subpixel, the second light-emitting layer is included in a second subpixel, the third light-emitting layer is included in a third subpixel, and the first subpixel, the second subpixel, and the third subpixel are included in one pixel of a display region.

* * * * *